United States Patent
Tominaga

(10) Patent No.: US 7,827,036 B2
(45) Date of Patent: Nov. 2, 2010

(54) DATA PROCESSING SYSTEM, DATA PROCESSING METHOD, DATA PROCESSOR, AND DATA PROCESSING PROGRAM

(75) Inventor: Takehiro Tominaga, Tokyo (JP)

(73) Assignee: Sony Corporation, Tokyo (JP)

( * ) Notice: Subject to any disclaimer, the term of this patent is extended or adjusted under 35 U.S.C. 154(b) by 1806 days.

(21) Appl. No.: 10/508,671

(22) PCT Filed: Apr. 17, 2003

(86) PCT No.: PCT/JP03/04885
§ 371 (c)(1),
(2), (4) Date: Sep. 22, 2004

(87) PCT Pub. No.: WO03/092167
PCT Pub. Date: Jun. 11, 2003

(65) Prior Publication Data
US 2005/0240414 A1    Oct. 27, 2005

(30) Foreign Application Priority Data
Apr. 25, 2002 (JP) .............................. 2002-123533

(51) Int. Cl.
*G10L 19/00* (2006.01)
(52) U.S. Cl. ...................... 704/500; 704/201; 704/227
(58) Field of Classification Search ......... 704/500–504, 704/227, 200, 201; 375/240.26; 341/50
See application file for complete search history.

(56) References Cited

U.S. PATENT DOCUMENTS

| 6,094,636 A * | 7/2000 | Kim ........................... 704/500 |
| 6,295,009 B1 * | 9/2001 | Goto ........................... 341/50 |
| 6,879,634 B1 * | 4/2005 | Oz et al. ................. 375/240.26 |
| 2002/0037037 A1 | 3/2002 | Van Der Schaar |
| 2002/0038216 A1 | 3/2002 | Suzuki |

FOREIGN PATENT DOCUMENTS

| JP | 08-46960 A | 2/1996 |
| JP | 10-262245 | 9/1998 |

(Continued)

OTHER PUBLICATIONS

Office Action from Japanese Patent Office issued on Jan. 23, 2007, for Japanese application JP 2002-123533.

(Continued)

*Primary Examiner*—Huyen X. Vo
(74) *Attorney, Agent, or Firm*—Rader, Fishman & Grauer PLLC

(57) ABSTRACT

An input data is divided into blocks of predetermined time units and then further divided into a plurality of bands. Each band is coded and compressed to prepare a basic sub-block essential for data reproduction and a plurality of extension sub-blocks contributing to improvement of the quality of the reproduced data. A transmission timing during streaming delivery, remaining extension sub-blocks are delivered if the time period is still within a time period for delivering the same data block, but the remaining extension sub-blocks are not delivered and delivery of the basic sub-block of the subsequent data block begins if the delivery timing for the subsequent data block has arrived. In this way, a stable streaming delivery is achieved by a scalable data compression.

18 Claims, 23 Drawing Sheets

FOREIGN PATENT DOCUMENTS

| | | |
|---|---|---|
| JP | 11-251917 A | 9/1999 |
| JP | 2001-057570 | 2/2001 |
| JP | 2002-094385 | 3/2002 |
| JP | 2002-94385 A | 3/2002 |
| WO | WO 00/72601 | 11/2000 |

OTHER PUBLICATIONS

International Search Report dated Jul. 15, 2003.
Supplementary EPO Search Report mailed Oct. 26, 2005.

* cited by examiner

TRANSMISSION DATA STREAM
FOR TIME BLOCK t=0

TRANSMISSION DATA STREAM
FOR TIME BLOCK t=$T_B$

TRANSMISSION DATA STREAM
FOR TIME BLOCK t=$2T_B$

DATA PROCESSING SYSTEM, DATA PROCESSING METHOD, DATA PROCESSOR, AND DATA PROCESSING PROGRAM

TECHNICAL FIELD

The present invention relates to a data processing system for transmitting and receiving data via a communication line, a data processor and a data processing method for preparing, transmitting, and receiving data to be distributed, and a data processing program. More specifically, the invention relates to a data processing system for streaming delivery of data via a communication line, a data processor and a data processing method for preparing, transmitting, and receiving data for stream-delivering, and a data processing program.

Furthermore, the present invention relates to a data processing system for streaming delivery of data via a communication line having a variable bandwidth, a data processor and a data processing method for preparing, transmitting, and receiving data for streaming delivery, and a data processing program. More specifically, the invention relates to a data processing system enabling stable streaming delivery by applying a scalable data compression method, a data processor and a data processing method for preparing, transmitting, and receiving data for streaming delivery by applying a scalable data compression method, and a data processing program.

BACKGROUND ART

Today, data processing and data communication technology are highly developed. As a result, in addition to usual computer data, various types of data such as images (still images and moving images) and audio are processed electronically.

In general, image and audio data contains a large amount of redundant data and has an extremely large size. Thus, if the image or audio data is stored on a storage device or transmitted through a network in its original form, the load on the memory capacity and/or the communication line becomes large. Therefore, when storing or transmitting image or audio data, the redundancy of the original data is eliminated by encoding the data; in other words, the original data is compressed. The compressed image data is decompressed before it is used.

An example of a known high-efficiency coding and compression method for an audio signal is adaptive transform acoustic coding (ATRAC). In ATRAC, the audio signal is divided into four frequency bands by a band-dividing filter. Then, the divided bands are compressed after the time line data stream is transformed into a frequency axis data stream by modified discrete cosine transform (MDCT). In this case, the absolute threshold of hearing and the audio masking effect are applied to eliminate audio components that are difficult to hear and the data before and after a loud sound. In this way, the amount of coded data is reduced without degrading the quality of the sound a user hears.

Coding and compression of data, in general, are performed and adjusted so that the data maintains a predetermined data compression rate (bit rate) and a compression-decompression quality. Thus, when data is delivered via a plurality of lines having different bandwidths or a line having a variable transmission quality, the data must be compressed at a rate suitable for the bandwidth and/or a plurality of compressed bit streams having a predetermined quality must be generated.

Recently, a 'streaming' technology in which data is reproduced while it is downloaded is widely used on the Internet. However, there is a problem in that the bandwidth is variable. For example, it is common for a client computer to carry out FIFO buffering to deal with a temporary reduction in the amount of transferred data or jitter. To respond to a large change in the amount of transferred data, a plurality of data streams is prepared by encoding the original data in a plurality of bit rates. Then, the data stream to be delivered is dynamically selected in accordance with the communication conditions between the server and the client, and is delivered to the client. An example of the latter case is Sure Stream by Real Networks, Inc.

When the above-mentioned methods are used, the first set of data is not reproduced until the FIFO buffer is filled. As a result, there is a delay of several seconds before the streaming begins. When one data stream is selected among a plurality of data streams in accordance with the communication conditions, the compression process becomes complex because a plurality of datasets have to be prepared for one original dataset. Moreover, managing the system for delivering the data becomes complicated because extra data storage space and communication lines are required to store and transfer the plurality of datasets.

DISCLOSURE OF INVENTION

An object of the present invention is to provide an excellent data processing system for suitably streaming data via a communication line having a variable bandwidth, an excellent data processor and a data processing method for preparing, transmitting, and receiving data for streaming delivery, and a data processing program.

Another object of the present invention is to provide an excellent data processing system for providing a stable streaming delivery using a scalable data compression method, an excellent data processor and a data processing method for preparing, transmitting, and receiving data for streaming delivery by a scalable data compression method, and an excellent data processing program.

The present invention has taken into consideration the above-mentioned objects. A data processing system comprises: a first data processor comprising transmission data generating means for preparing a basic sub-block essential for reproducing original data and at least one extension sub-block essential for improving the quality of the reproduced data by dividing the original data into a plurality of blocks, further dividing each of the plurality of blocks into a plurality of frequency bands, and then compressing the data of the plurality of frequency bands, transmission means for transmitting the prepared basic sub-block and said at least one extension sub-block, timing generating means for generating a timing for transmitting the basic sub-block and said at least one extension sub-block, and transmission controlling means for transmitting the basic sub-block of a current block based on the timing generated by the timing generating means, for determining, after transmitting the basic sub-block, whether said at least one extension sub-block of the current block can be transmitted before a basic sub-block of a subsequent block is transmitted, and for selectively transmitting said at least one extension sub-block of the current block if it has been determined that said at least one extension sub-block can be transmitted; and a second data processor comprising receiving means for receiving a basic sub-block and at least one extension sub-block transmitted from the first data processor, reproducing means for reproducing data from the sub-blocks received by the receiving means, and reproduction controlling means for reproducing data, if the sub-block received is determined to be a basic sub-block, by supplying the basic sub-block and said at least one extension sub-block received by the receiving means before a subsequent basic sub-block is received by the receiving means to the reproducing means.

The term 'system,' however, refers to a logical assembly of a plurality of apparatuses (or functional modules for realizing a predetermined function). Therefore, there are no limitations on whether the apparatuses or functional modules are disposed in a single chassis.

According to the present invention, by applying a scalable data compression method for dividing the original data into time block units, further dividing these time block units into bands, and then encoding these bands, datasets having various bit rates can be generated from one set of data.

Accordingly, the storage capacity for the streaming data required for the server can be reduced. Since the protocol for controlling the data transfer rate is simplified, a standard protocol such as a transmission control protocol (TCP) can be used for stable streaming delivery. Furthermore, since the original data is divided into sub-blocks and then each sub-block is coded and compressed individually, each compression calculation unit can be small (or, in other words, the computational load of the coding process is small).

For example, when audio data is processed, the original audio data is divided into an audible frequency band (0 to 22 kHz) and other frequency bands (frequency bands exceeding 22 kHz may be divided into a plurality of frequency bands) for each time block. Then, each frequency band is coded and compressed. Coding and compression are carried out by modified discrete cosine transform (MDCT) and quantization. In the process of coding and compression, compression components and quantization error components are output. The compression component for audio frequency is essential for data reproduction and is assigned as a basic sub-block. The quantization error component for audio frequency, and the compression components and the quantization components of other bandwidths contribute to an improvement in the quality of the data reproduced and are assigned as extension sub-blocks.

Depending on the characteristics of the data, the data of a quantization error component may be large. In such a case, the coding and compression process may be applied recursively to the quantization error component. In this way, compression components and quantization error components are further generated from the quantization error component. These compression and quantization error components may be included in the stream data as extension sub-blocks.

In this way, data is processed by dividing the data into a plurality of sub-blocks having a hierarchical structure in the predetermined time units. Resource amount calculation information may be added to each sub-block for determining the amount of resource required for transferring the sub-block. The resource amount calculation information is used for calculating the incremental block transfer rate due to the transfer of sub-blocks and, for example, is the data length indicating the size of the sub-block. Instead of data length, difference in the block transfer rate for when the sub-block is and is not transferred may be used. For example, a hierarchy ID for identifying the time block and band the sub-block belongs to may be added in addition to the data length of the sub-block to each sub-block.

In streaming delivery, the first data processor that delivers the data by functioning as a stream server transmits the basic sub-block of each predetermined time unit without fail whereas the number of extension sub-blocks to be delivered is dynamically controlled in accordance with the bandwidth. In other words, when a transmission timing is detected, the data block to be transmitted is determined. For example, if the detected transmission timing arrives within a time period for transmitting the same data block, the remaining extension sub-blocks may be transmitted. If, however, the detected transmission timing arrives within a time period for transmitting the subsequent data block, the remaining sub-blocks of the previous data blocks are not transmitted and, instead, the basic sub-block for the subsequent data block is transmitted. Here, the term 'timing for transmission' refers to a time when a subsequent dataset can be delivered through a transmission line or a time equivalent. For example, the time when a free space is generated in a protocol buffer used for absorbing the delivery jitter may be used as the timing for transmission.

The second data processor for receiving a data stream that is the client carries out streaming reproduction by decoding and decompressing the basic sub-block for each time block by inverse-quantization and inverse-MDCT and uses the extension sub-blocks to improve the quality of the reproduced data. The receiver is not aware of how many extension sub-blocks per time block are delivered, but, by identifying the sub-blocks according to their hierarchy IDs, the data can be reproduced. Moreover, the receiver can refer to the hierarchy IDs, as required, to select or refuse sub-blocks in predetermined hierarchal levels. For example, an amount of data indicated by a data length can be skipped in the data stream to eliminate unwanted extension sub-blocks. In other words, the receiver can select the quality of decompression for decoding and decompressing the received data. Since each sub-block is decoded and decompressed individually, each compression calculation unit can be small (or, in other words, the computational load of the coding process is small).

A data processing method according to a second aspect of the present invention comprises the steps of generating a basic sub-block essential for reproducing original data and extension sub-blocks essential for improving the quality of the reproduced data by dividing the original data into a plurality of blocks, further dividing each of the plurality of blocks into a plurality of frequency bands, and then compressing one of the plurality of frequency bands, and transmitting the basic sub-block of a current block based on the timing generated by a timing generating means, determining, after transmitting the basic sub-block, whether the extension sub-blocks of the current block can be transmitted before a basic sub-block of a subsequent block is transmitted, and selectively transmitting the extension sub-blocks of the current block if it has been determined that the extension sub-blocks can be transmitted.

According to the data processing method according to the second aspect of the present invention, scalable hierarchically-compressed data is obtained. From this data, blocks of data having various bit rates are produced. Streaming delivery of such hierarchically-compressed data reduces the storage capacity on the server used for the streaming data.

Since the protocol for controlling the data transfer rate is simplified, a standard protocol such as a transmission control protocol (TCP) can be used to provide a stable streaming delivery through the Internet, which has a variable bandwidth.

Furthermore, since each sub-block is decoded and decompressed individually, each compression calculation unit can be small (or, in other words, the computational load of the coding process is small).

According to the transmission data generating means or the step for generating transmission data, data of a time block unit is divided into a band essential for data reproduction and at least one other band, a calculation for coding and compression is applied to each band, a compression component of the band essential for data reproduction is assigned as a basic sub-block, and compression components of the bands excepting the essential band and compression error components of all the bands are assigned as extension sub-blocks.

According to the transmission data generating means or the step for generating transmission data, the compression error components for all bands may be recursively coded and compressed and the recursive compression components and the recursive compression error components may be assigned as extension sub-blocks.

In this way, input data is divided into blocks of predetermined time units and then further divided into a plurality of bands. Each band is coded and compressed to prepare a hierarchical structure of a basic sub-block essential for data reproduction and a plurality of extension sub-blocks not essential for data reproduction but that contribute to improvement of the quality of the reproduced data.

The hierarchically-compressed data is scalable. Therefore, when the compressed data is decompressed, the data stream can be selectively decompressed entirely or partially to select and adjust the quality of the decompressed data.

According to the transmission data determining means or the step for determining the transmission data, hierarchy IDs and data lengths may be added to the sub-blocks as resource amount calculation information for determining the amount of resource required for transferring the sub-blocks. Instead of data length, difference in the data lengths may be added. Based on the resource amount calculation information, the incremental block transfer rate due to the transfer of sub-blocks can be calculated. Consequently, when scalable compressed data is recorded, read out, or transmitted, the subsequent sub-block can be read out quickly by identifying the sub-block based on the hierarchy ID and by skipping an amount of data indicated by the data length and forwarding to a new readout position.

According to the transmission data determining means or the step of determining the transmission data, the transmission of a basic sub-block for a time block is determined and an extension sub-block to be transmitted is selected in accordance with the bandwidth during data streaming delivery.

For example, if the detected transmission timing is in the same time block as the last sub-block delivered or, in other words, if there is still some remaining time for transmitting data in the time block in which the last data transmission was performed, whether the remaining extension sub-blocks in the same time block are transmitted is determined. As a result, in addition to the basic sub-block essential for data reproduction, a number of extension sub-blocks in accordance with the bandwidth may be transmitted. Thus, the client receiving the data can perform high-quality data reproduction.

If, at the transmission timing detected, the transmission period in the same time block as that in which the last sub-block was delivered has already elapsed, it is determined to transmit the basic sub-block of the time block corresponding to the detected transmission timing. As a result, if there is no leeway in the bandwidth, at least the basic sub-block is transmitted to avoid interruption of the reproduced data at the client that receives the data.

A data processing method according to a third aspect of the present invention comprises the steps of receiving a basic sub-block and extension sub-blocks, and reproducing data, if the sub-block received is determined to be a basic sub-block, from the basic sub-block and the extension sub-blocks received before a subsequent basic sub-block is received.

According to the data processing method according to the third aspect of the present invention, interruption of the reproduced data is avoided by reproducing the data using at least a basic sub-block if there is no leeway in the bandwidth. If there is leeway in the bandwidth, an extension sub-block is selected from the plurality of extension sub-blocks received before a subsequent basic sub-block is received and then data is reproduced from the selected extension sub-blocks and the basic sub-block. In this way, high-quality data reproduction is possible.

A data processing program according to a fourth aspect of the present invention written in a language readable by a computer so that data can be processed on a computer system, comprises the steps of dividing the data into a plurality of blocks of a predetermined time unit, generating a basic sub-block essential for reproducing original data and at least one extension sub-block essential for improving the quality of the reproduced data by dividing the original data into a plurality of blocks, further dividing each of the plurality of blocks into a plurality of frequency bands, and then compressing one of the plurality of frequency bands, and transmitting a basic sub-block of a predetermined time unit, determining, after transmitting the basic sub-block, whether said at least one extension sub-block of the current block can be transmitted before a basic sub-block of a subsequent block is transmitted, and transmitting said at least one extension sub-block if it has been determined that said at least one extension sub-block can be transmitted.

A data processing program according to a fifth aspect of the present invention written in a language readable by a computer so that data can be processed on a computer system, comprises the steps of determining whether the received sub-block is a basic sub-block and reproducing data, if the received sub-block is a basic sub-block, from the basic sub-block and at least one extension sub-block received before a subsequent basic sub-block is received.

The computer program according to the fourth and fifth aspect of the present invention defines a computer program written in a language readable by a computer. In other words, by installing the computer program according to the fourth and fifth aspect of the present invention, a cooperative operation is carried out on the computer system and results similar to the data processing method according to the second and third aspects are achieved.

Other objects, characteristics, and advantages of the present invention will be apparent through the detailed descriptions based on the embodiments and drawings.

BEST MODE FOR CARRYING OUT THE INVENTION

Figure 1:
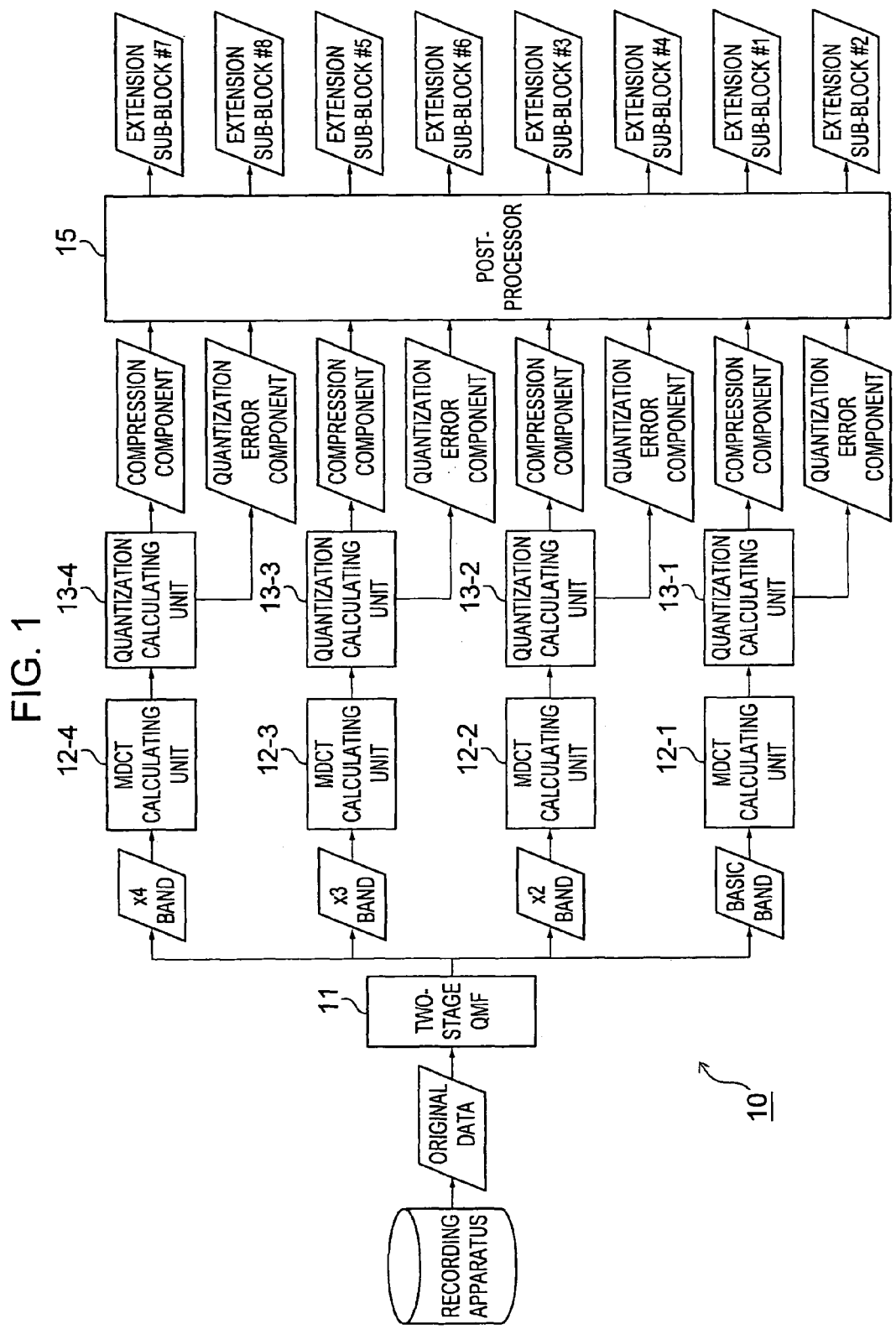
FIG. 1 is a schematic view of the data compression mechanism used for streaming delivery according to an embodiment of the present invention.

Embodiments of the present invention will now be described in detail by referring to the drawings.

A. Overview

When data streaming is performed by using a communication line having a variable bandwidth, such as the Internet, a scalable data compression method that can be adapted to the various compression rates in accordance with the bandwidth is required.

Accordingly, in the present invention, data is divided into blocks of predetermined time units that are further divided into a plurality of bands. Then, each band is coded and compressed to prepare a hierarchical structure including a basic sub-block that is essential for the reproduction of the data and a plurality of extension sub-blocks that are not essential for data reproduction but contribute to the improvement of the quality of the reproduced data.

In streaming delivery, the basic sub-block of each predetermined time unit is transmitted without fail whereas the number of extension sub-blocks to be delivered is dynamically controlled in accordance with the bandwidth. In other words, when a transmission timing is detected, the data block to be transmitted is determined. For example, if the detected transmission timing arrives within a time period for transmitting the same data block, the remaining extension sub-blocks may be transmitted. If, however, the detected transmission timing arrives within a time period for transmitting the subsequent data block, the remaining sub-blocks of the previous data blocks are not transmitted and, instead, the basic sub-block for the subsequent data block is transmitted.

By applying a scalable data compression method for dividing the original data into time block units, further dividing these time block units into bands, and then encoding these bands, datasets having various bit rates can be generated from one set of data. Accordingly, the storage capacity for the streaming data required for the server can be reduced. Since the protocol for controlling the data transfer rate is simplified, a standard protocol such as a transmission control protocol (TCP) can be used for stable streaming delivery. Furthermore, since the original data is divided into sub-blocks and then each sub-block is coded and compressed individually, each compression calculation unit can be small (or, in other words, the computational load of the coding process is small).

For example, when audio data is delivered by streaming, the original audio data is divided into an audible frequency band (0 to 22 kHz) and other frequency bands (frequency bands exceeding 22 kHz may be divided into a plurality of frequency bands) for each time block. Then, each frequency band is coded and compressed. Coding and compression are carried out by modified discrete cosine transform (MDCT) and quantization. In the process of coding and compression, compression components and quantization error components are output. The compression component for audio frequency is essential for data reproduction and is assigned as a basic sub-block. The quantization error component for audio frequency, and the compression components and the quantization components of other bandwidths contribute to an improvement in the quality of the data reproduced and are assigned as extension sub-blocks.

Depending on the characteristics of the data, the data of a quantization error component may be large. In such a case, the coding and compression process may be applied recursively to the quantization error component. In this way, compression components and quantization error components are further generated from the quantization error component. These compression and quantization error components may be included in the stream data as extension sub-blocks.

In this way, data is divided into a hierarchical structure of a plurality of sub-blocks in predetermined time units. Each sub-block includes a hierarchy ID for indicating which time block and band the sub-block belongs to and a data length for indicating the size of the sub-block.

A client that is the receiver of a data stream carries out streaming reproduction by decoding and decompressing the basic sub-block for each time block by inverse-quantization and inverse-MDCT and uses the extension sub-blocks to improve the quality of the reproduced data. The receiver is not aware of how many extension sub-blocks per time block are delivered, but, by identifying the sub-blocks according to their hierarchy IDs, the data can be reproduced. Moreover, the receiver can refer to the hierarchy IDs, as required, to select or refuse sub-blocks in predetermined hierarchal levels. For example, an amount of data indicated by a data length can be skipped in the data stream to eliminate unwanted extension sub-blocks. In other words, the receiver can select the quality of decompression for decoding and decompressing the received data. Since each sub-block is decoded and decompressed individually, each compression calculation unit can be small (or, in other words, the computational load of the coding process is small).

B. Scalable Data Compression

A scalable data coding and compression system 10 according to the present invention will now be described by referring to FIG. 1. For convenience, the data processed in the description below is audio data. Furthermore, the audio data will have a frequency band of no more than 88.2 kHz. In other words, the audio data has a sampling rate of 176.4 kHz.

Figure 2:
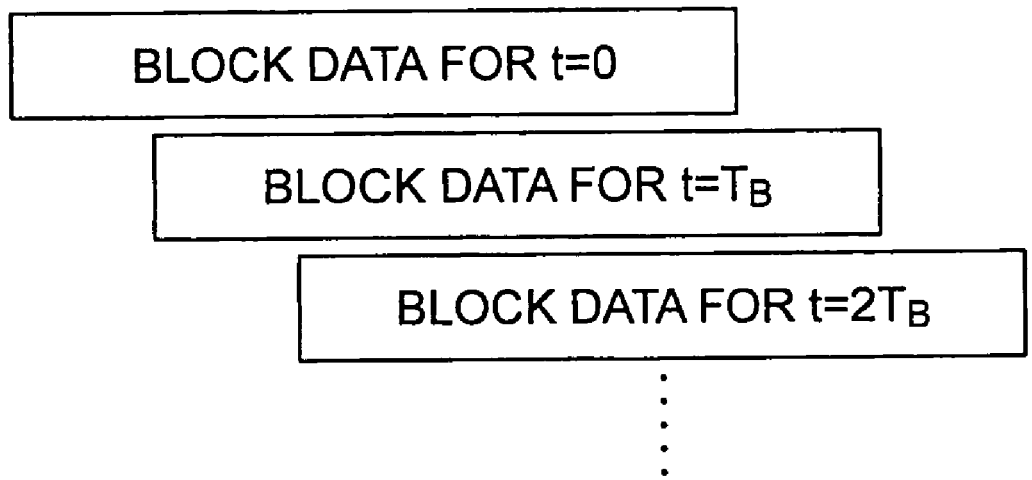
FIG. 2 is a schematic view of the data structure of the original data read out from a recording apparatus.

The original data is stored on a recording apparatus that can be randomly accessed, such as a hard disk or a magnetic-optical disk. The audio data is read out from the recording apparatus in predetermined time block $T_B$ units (refer to FIG. 2) and then divided into a plurality of sub-blocks in the frequency direction by a multiplex of quadrature mirror filters (QMFs).

The embodiment illustrated in FIG. 1 divides the audio data into sub-blocks in an audible frequency band of 0 to 22 kHz and frequency bands over 22 kHz with increments of 22 kHz by a two-stage QMF 11. Hereinafter, the audible frequency band is referred to as a 'basic band,' each band in 22-kHz increments exceeding 22 kHz will be referred to as an 'x2 band,' an 'x3 band,' and an 'x4 band,' in order. Obviously, the frequency band exceeding 22 kHz may be divided into different increments or may be treated as one sub-block in a single band without being divided.

To code and compress the divided bands, the time line data streams are transferred into frequency line data streams by a modified discrete cosine transform (MDCT) calculating unit 12 and then are quantized by a quantization calculating unit 13.

In this way, the output of the quantization calculating unit 13 for each band is composed of a compression component and a quantization error component.

Figure 3:
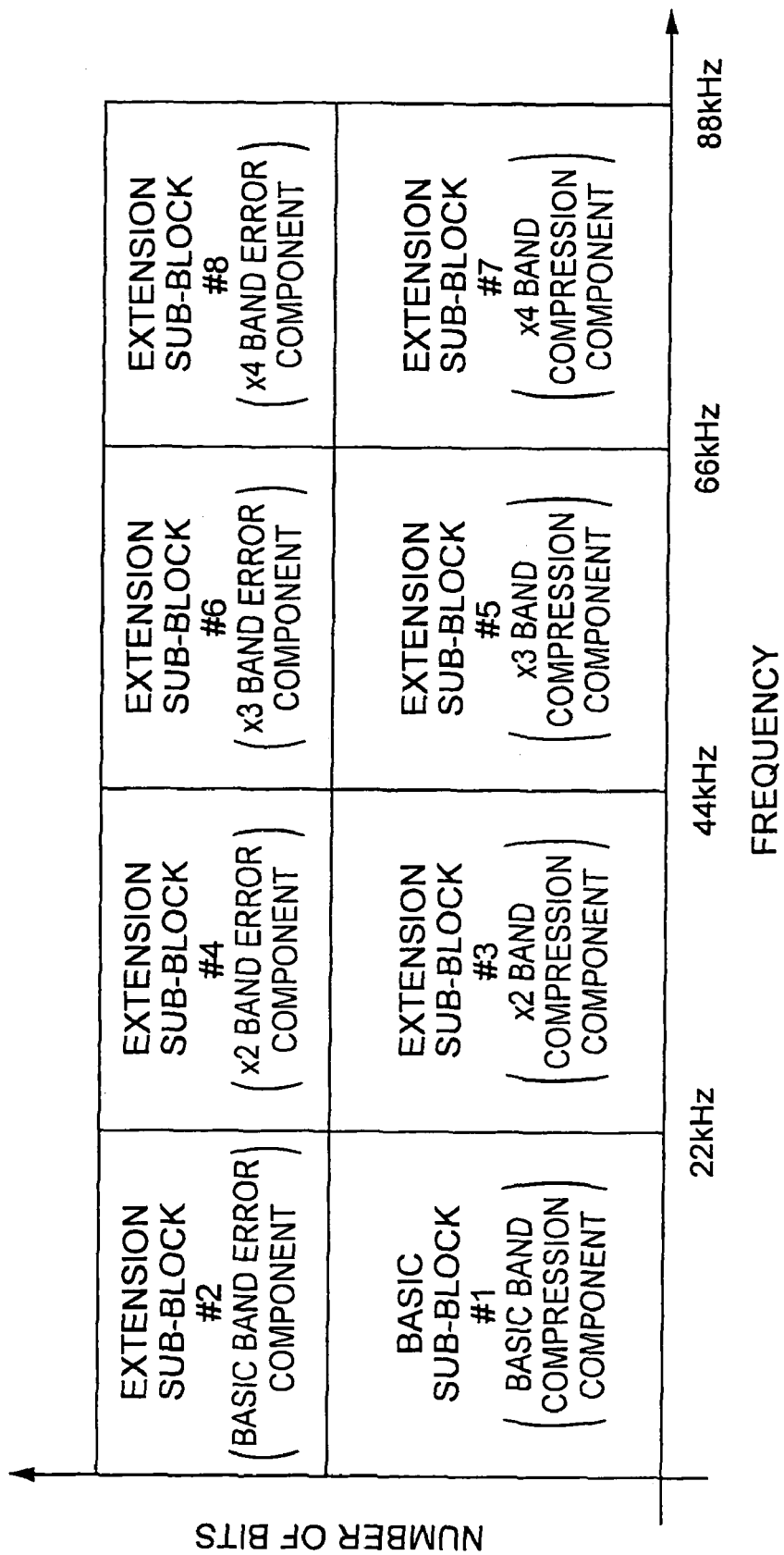
FIG. 3 is a schematic view of the hierarchical sub-block structure obtained by coding and compression by the data compression mechanism illustrated in FIG. 1.

As a result, as illustrated in FIG. 3, the original data sectioned into predetermined time blocks are further divided into a plurality of hierarchized sub-blocks. More specifically, the basic band has a hierarchical structure including a basic sub-block #1 composed of a compression component of the basic band and an extension sub-block #2 composed of a quantization error component of the basic band. The x2 band has a hierarchical structure including a basic sub-block #3 composed of a compression component of the x2 band and an extension sub-block #4 composed of a quantization error component of the x2 band. The x3 band has a hierarchical structure including a basic sub-block #5 composed of a compression component of the x3 band and an extension sub-block #6 composed of a quantization error component of the x3 band. The x3 band has a hierarchical structure including a basic sub-block #5 composed of a compression component of the x3 band and an extension sub-block #6 composed of a quantization error component of the x3 band. In this embodiment, the sub-blocks have variable lengths. The sub-blocks, however, may also be coded and compressed so that they have a fixed length.

Figure 4:
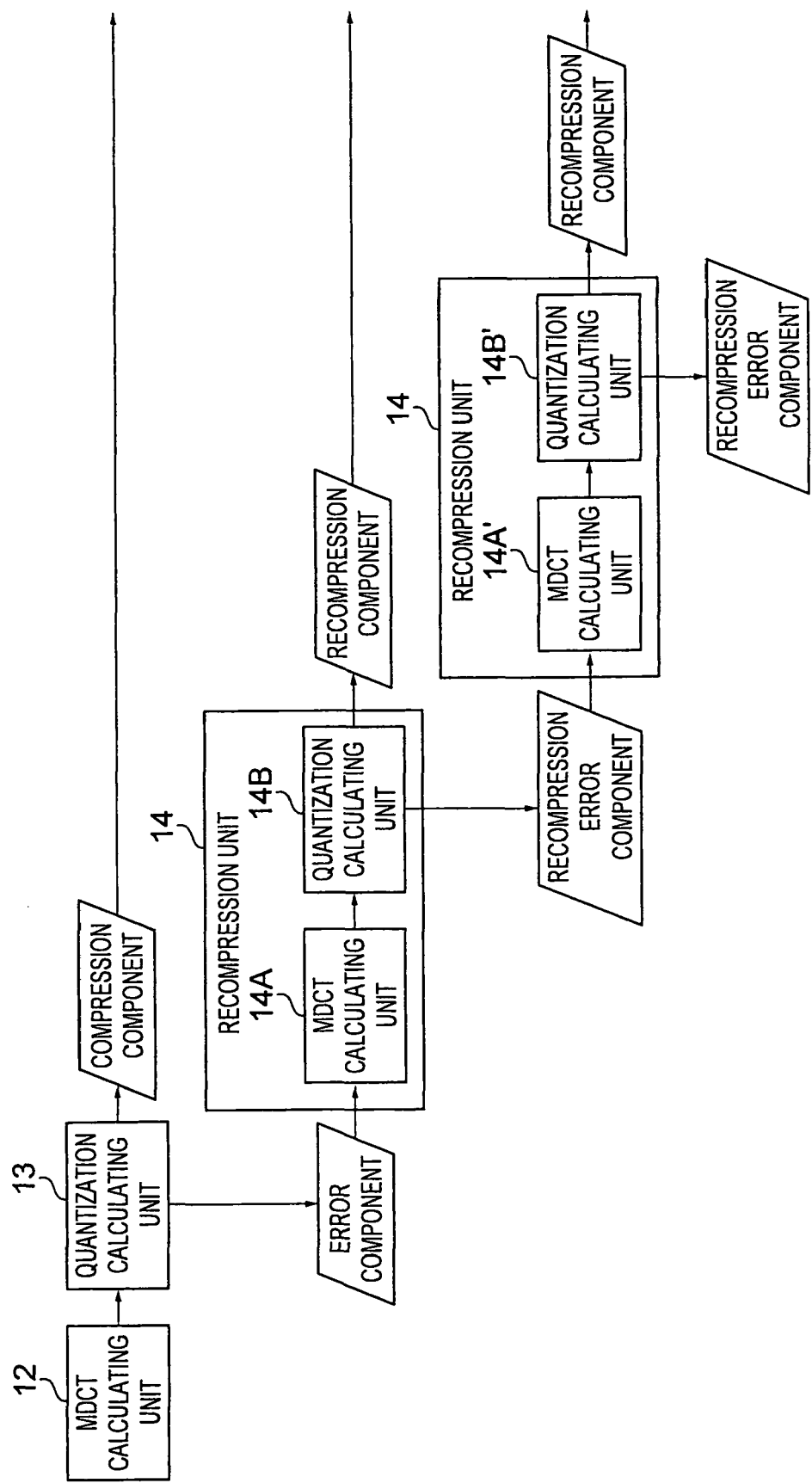
FIG. 4 illustrates the coding and compression mechanism for recursively compressing the quantization error components.
Figure 5:
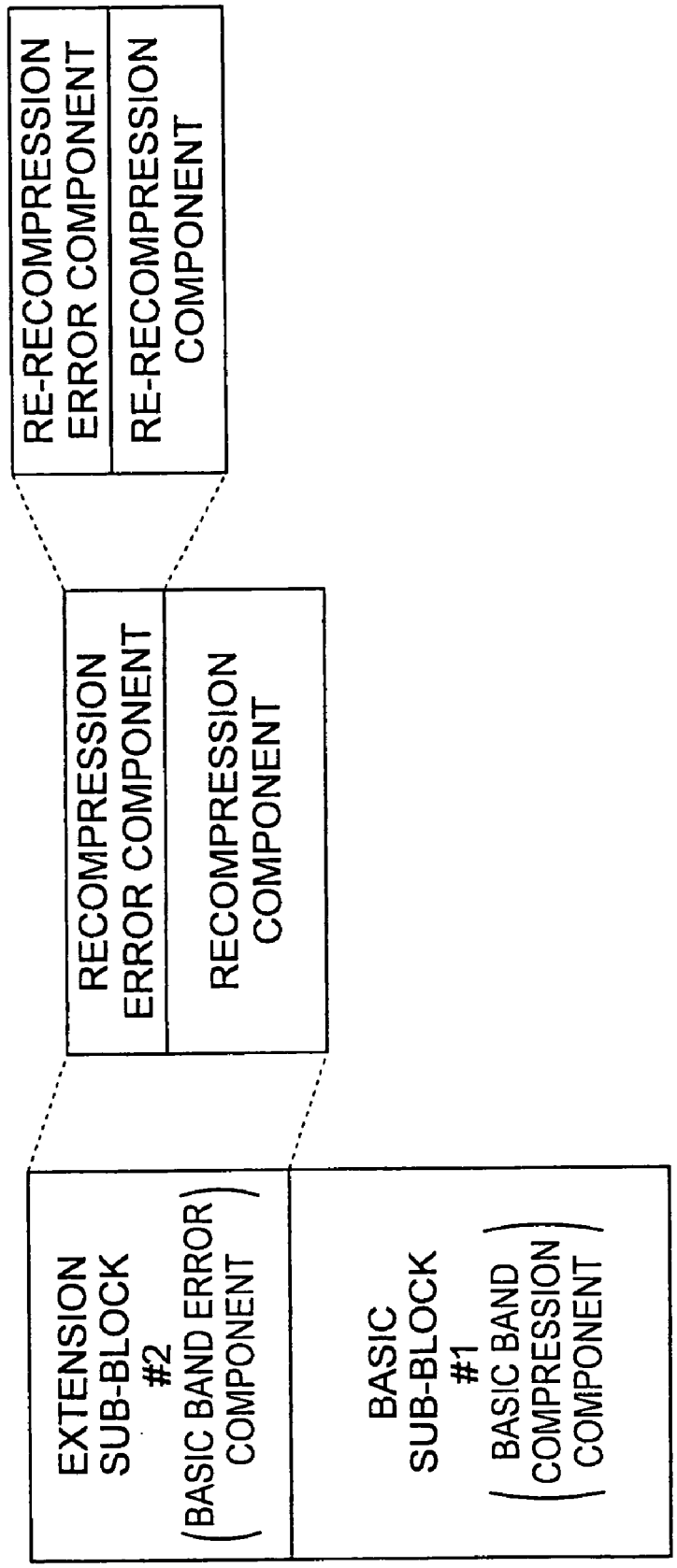
FIG. 5 illustrates the structure of the hierarchically-compressed data including recompression components and requantization error components of an extension sub-block.
Figure 6:
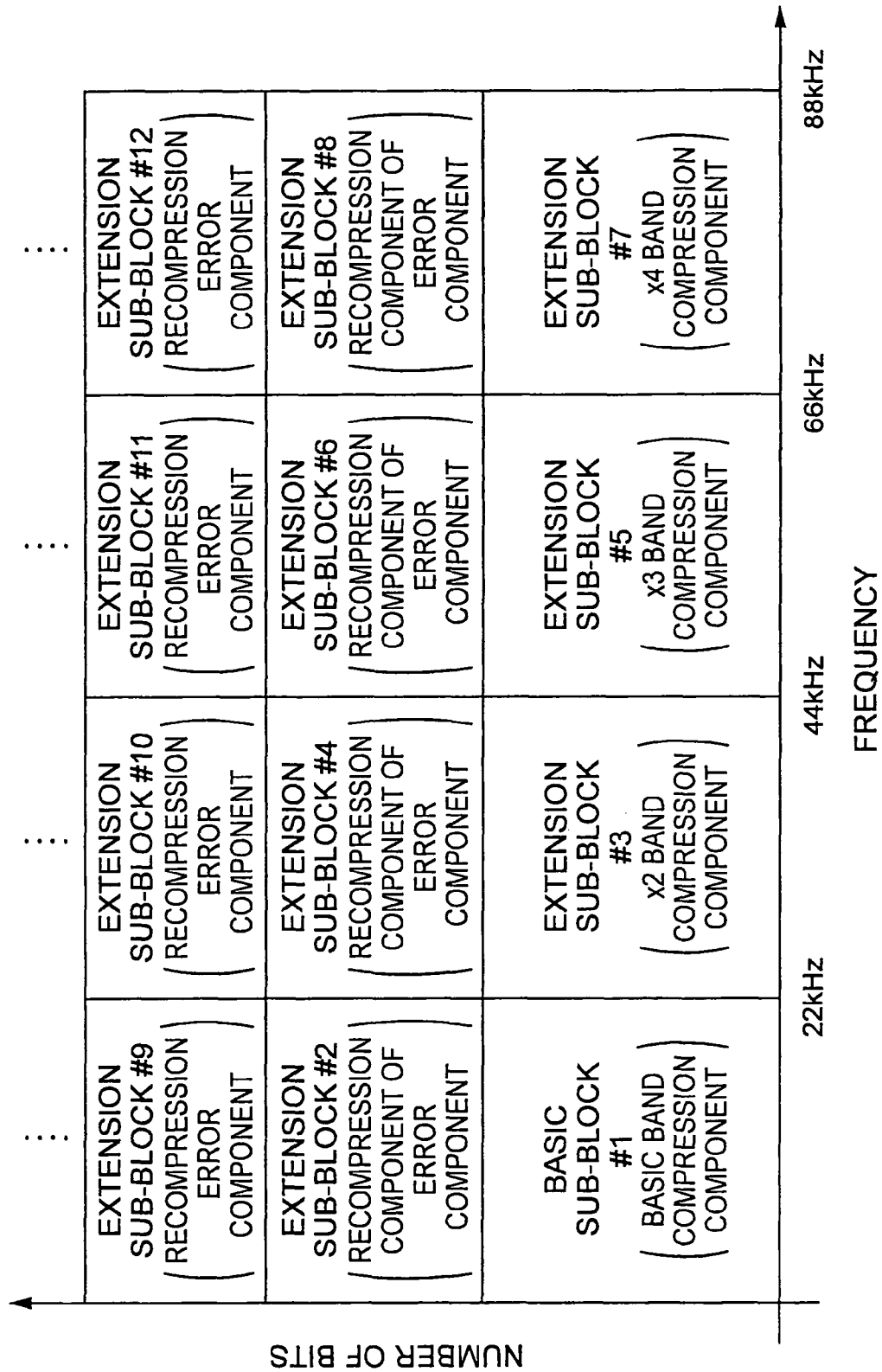
FIG. 6 illustrates the structure of the hierarchically-compressed data including compressed-recompression components and quantized-requantization error components of an extension sub-block.

Depending on the characteristics of the data, the data of a quantization error component may be large. In such a case, as illustrated in FIG. 4, the coding and compression process may be applied recursively to the quantization error component by a recompression unit 14. In this way, the recompression unit 14 further generates a recompression component and a requantization error component from the quantization error component. As illustrated in FIG. 5, these recompression and requantization error components may be included in a stream data as extension sub-blocks. Accordingly, as illustrated in FIG. 6, the extension sub-blocks can be further hierarchized by obtaining a compressed-recompression component and a quantized-requantization error component by further compressing the requantization error component.

The basic sub-block #1 is a component essential for reproducing the data. On the other hand, extension sub-blocks #2 to #8 are not essential for reproducing the data but contribute to an improvement in the quality of the data reproduction. There are two types of extension sub-blocks: a compression component of the original data and a quantization error component of the original data. However, without the corresponding-compression component, the quantization error component can not be used for data reproduction. (For example, to use the extension sub-block #4, the extension sub-block #3 must be decoded). As a band component is closer to the basic sub-block #1, the more significant is its contribution to the data reproduction.

Figure 7:
FIG. 7 is a schematic view of the data structure of the basic and extension sub-block.

At a post-processor 15, a hierarchy ID is added to the hierarchically coded and compressed sub-blocks to indicate which time block and band each of the sub-blocks belongs to. When a sub-block has a variable length, a data length will be added to the sub-block. FIG. 7 illustrates the data structure of a basic sub-block and an extension sub-block.

Figure 8:
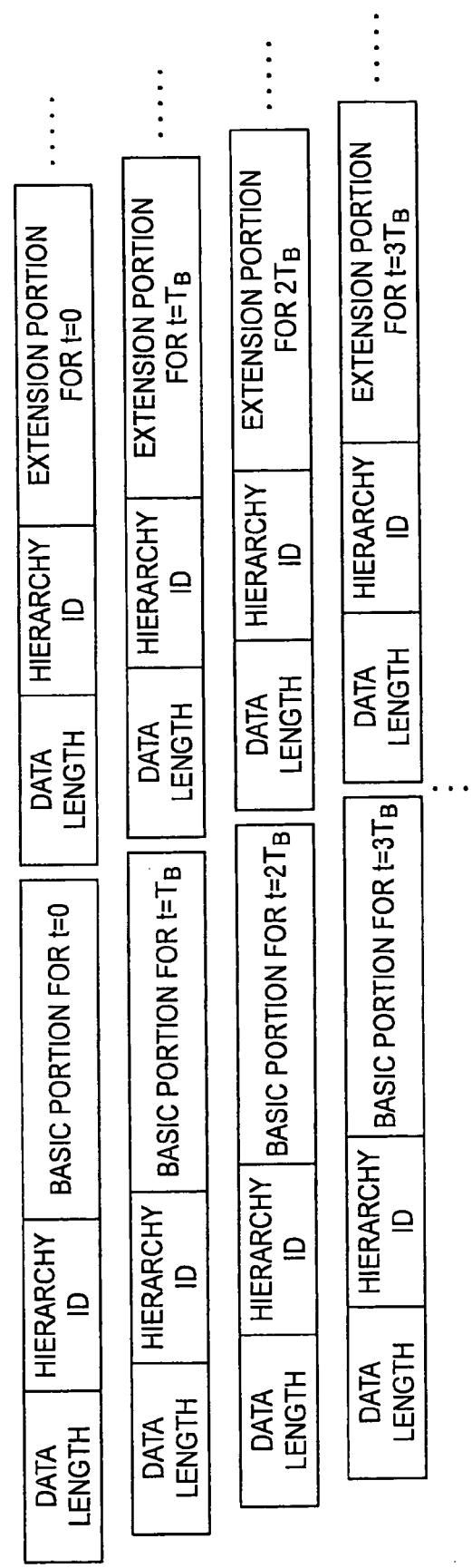
FIG. 8 is a schematic view illustrating the scalably hierarchically-compressed data stored in a storage apparatus.

The basic sub-blocks and the extension sub-blocks generated in such a manner are stored on a randomly accessible recording apparatus such as a hard disk device as time-series data (refer to FIG. 8). Which time block and band a sub-block belongs to can be identified for each sub-block stored on the recording apparatus by referring to the hierarchy ID added to the head of the sub-block. To proceed to a subsequent sub-block, the readout position is forwarded by skipping an amount of data indicated by the data length.

By dividing the compressed data and hierarchically recording the compressed data, the quality of the decompressed data is dynamically selected and controlled, realizing scalability of the compressed data. The quality of the compressed data is improved by detecting errors generated in the compression process and adding this information to the compressed data.

Figure 13:
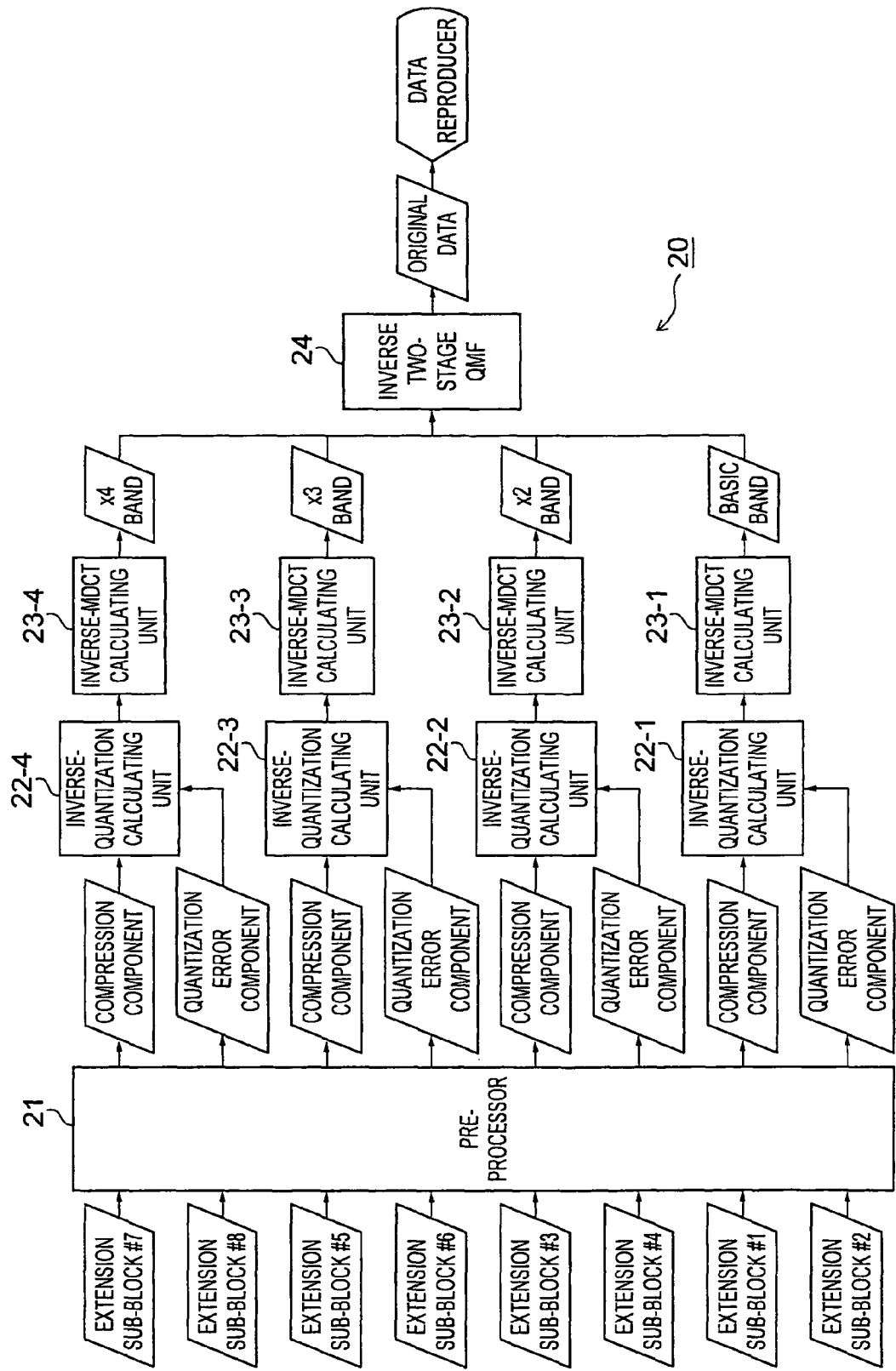
FIG. 13 is a schematic view illustrating the structure of a data decoding and decompression system 20 capable of performing a scalable data coding and compression.

FIG. 13 illustrates a data decoding and decompression system 20 corresponding to the above-described scalable data coding and compression. As illustrated in FIG. 13, the decompression system 20 includes a decoding and decompression unit for each of the audible, x2, x3, and x4 bands. The decompression system 20 multiplexes the decoding data for each band by inverse QMF to reproduce the original data.

A post-processor 21 reads the hierarchy ID of the received sub-block and sends the sub-block to a decoding and decompression unit of the corresponding band.

The decoding and decompression unit includes an inverse-quantization unit 22 and an inverse-MDCT calculating unit 23. The inverse-quantization unit 22 performs inverse-quantization on the compression component sub-block and the quantization error component sub-block of the corresponding band. If the quantization error sub-block has been recursively compressed, the sub-block is first decoded and decompressed and then sent to the inverse-quantization unit 22. The inverse-MDCT calculating unit 23 transfers a frequency line data stream into a time line data stream.

The decoded data for each band is multiplexed by an inverse-QMF 24 to reproduce the original data.

Figure 14:
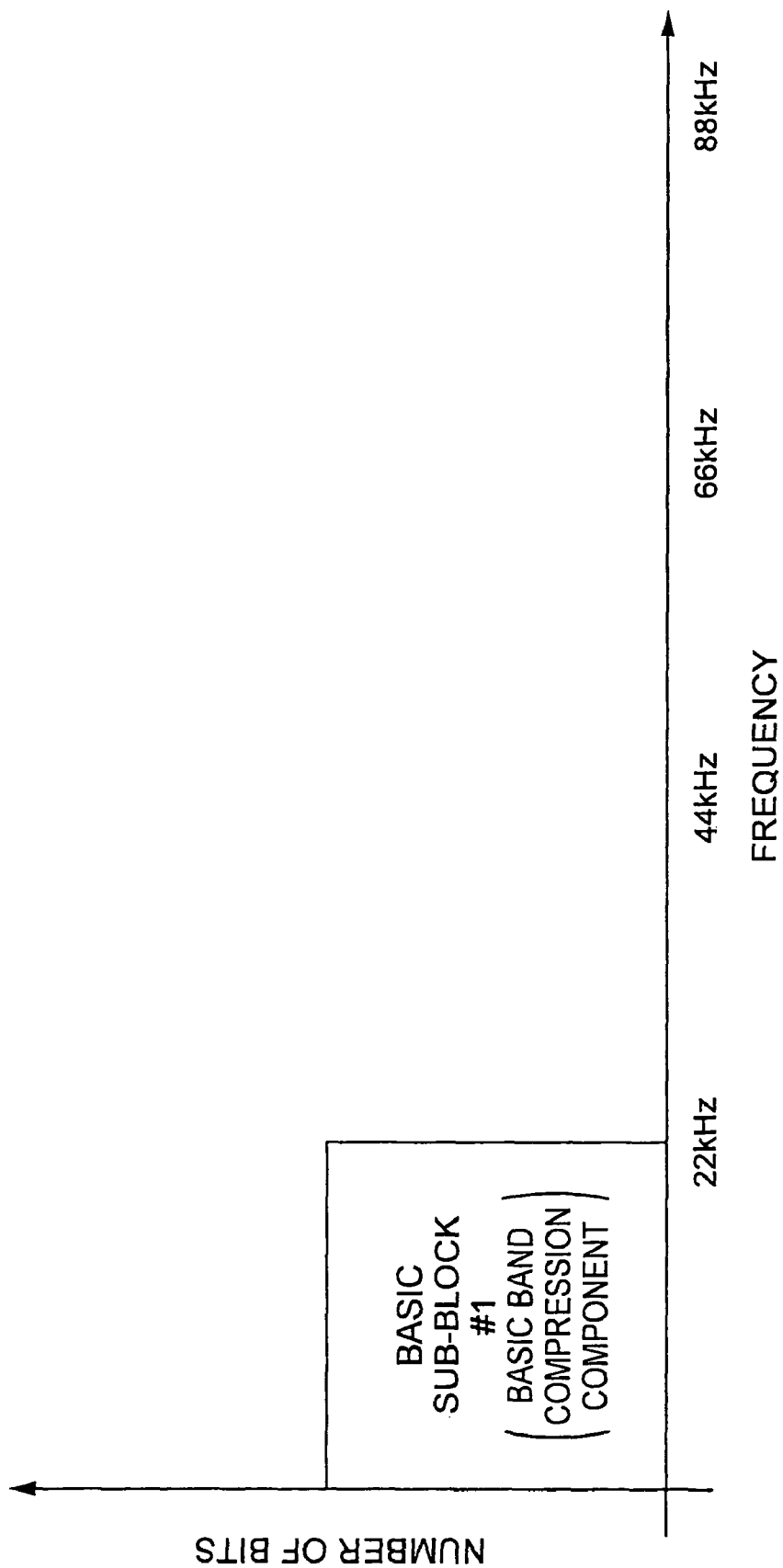
FIG. 14 illustrates the results of the decoding and decompression process performed on the scalably compressed data by the data decoding and decompression system 20.
Figure 15:
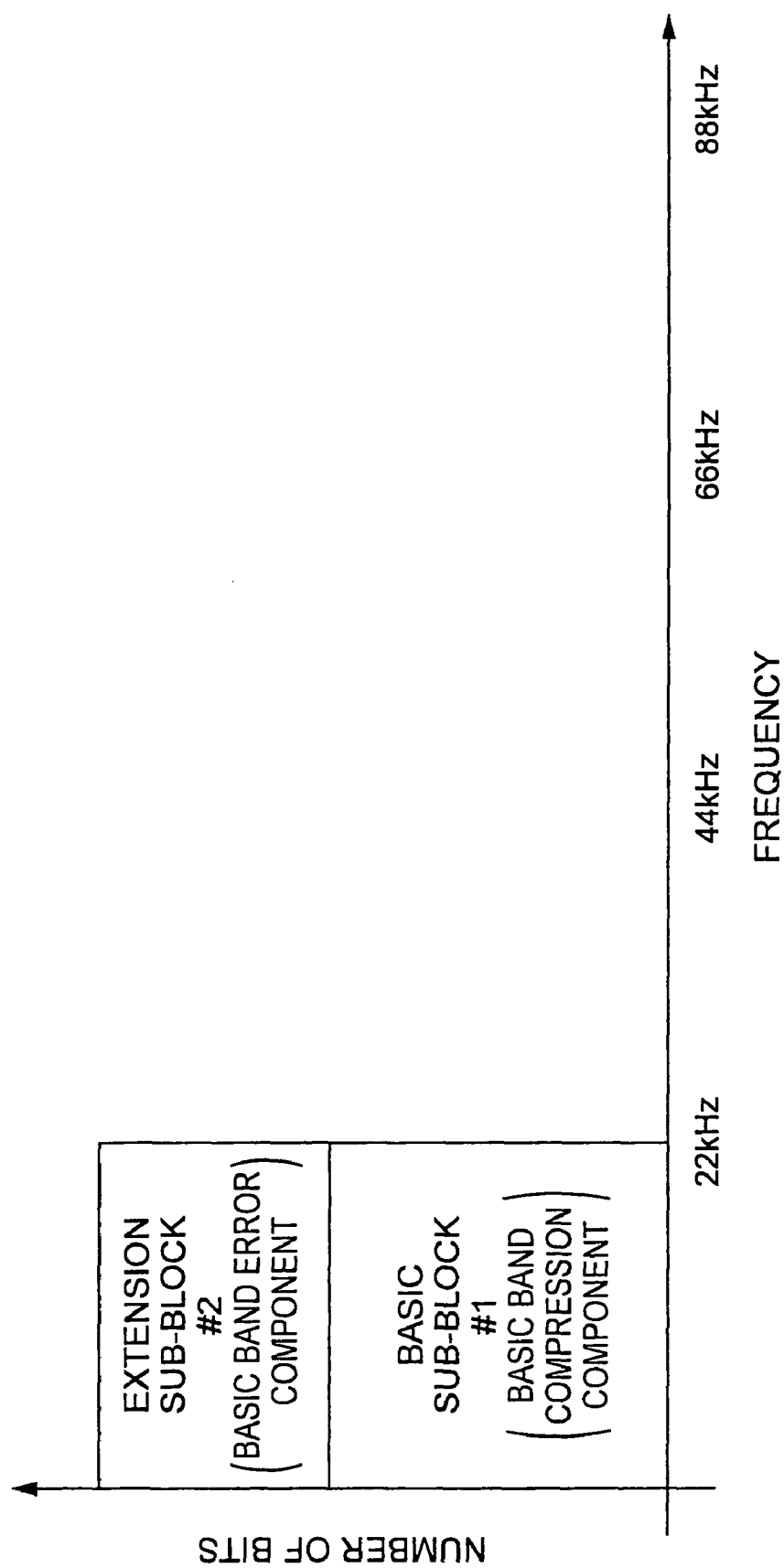
FIG. 15 illustrates the results of the decoding and decompression process performed on the scalably compressed data by the data decoding and decompression system 20.

The basic sub-block #1 is input into the data decoding and decompression system 20, and, then, inverse-quantization and inverse-MDCT are carried out to reproduce the audible frequency band of the original data (refer to FIG. 14). Subsequently, the extension sub-block #2 is input, and, then, the quantization error component generated when the audible frequency band was coded and compressed is reproduced (refer to FIG. 15). In this way, the audible frequency band is reproduced in high-quality.

Figure 16:
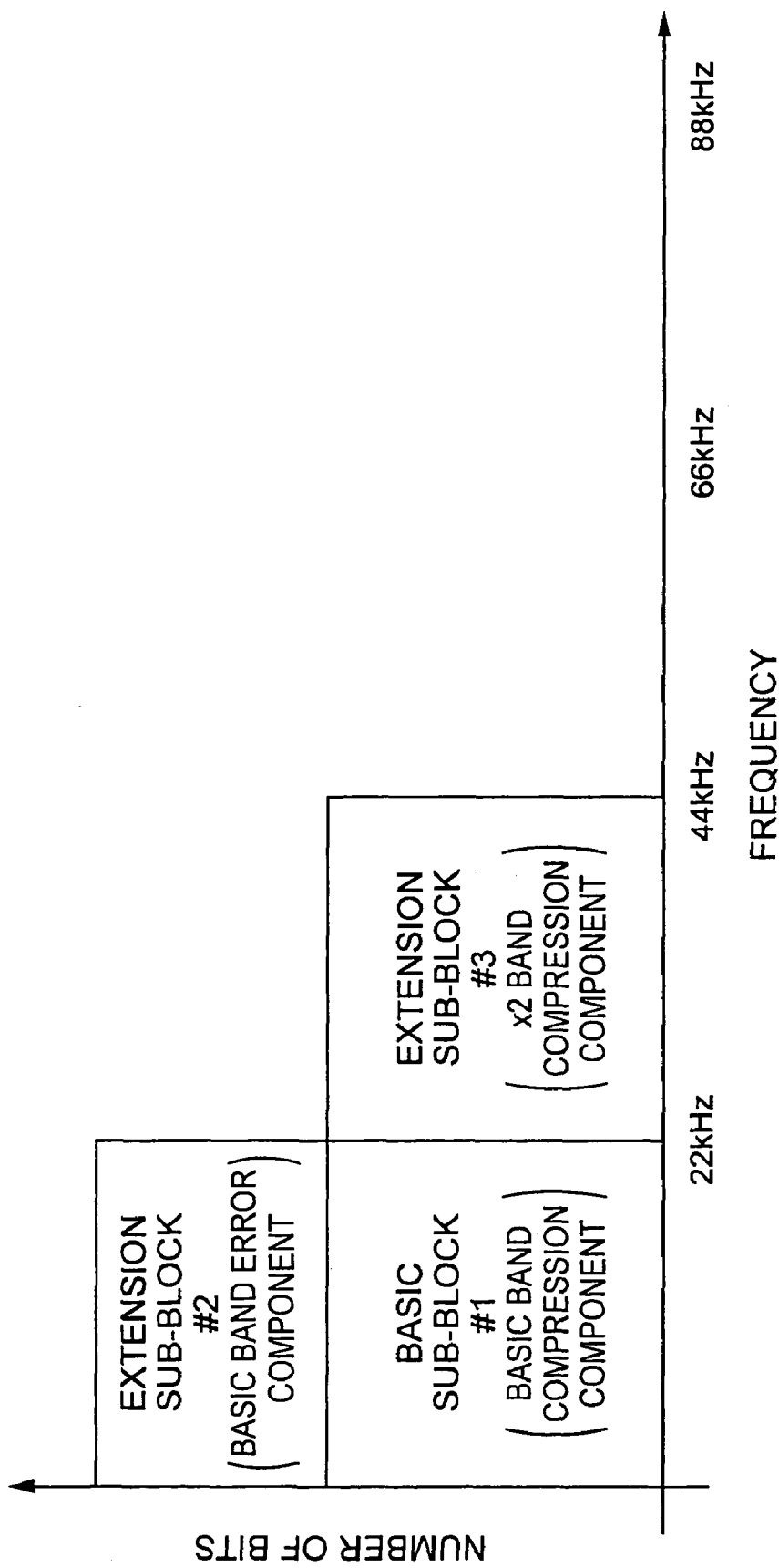
FIG. 16 illustrates the results of the decoding and decompression process performed on the scalably compressed data by the data decoding and decompression system 20.
Figure 17:
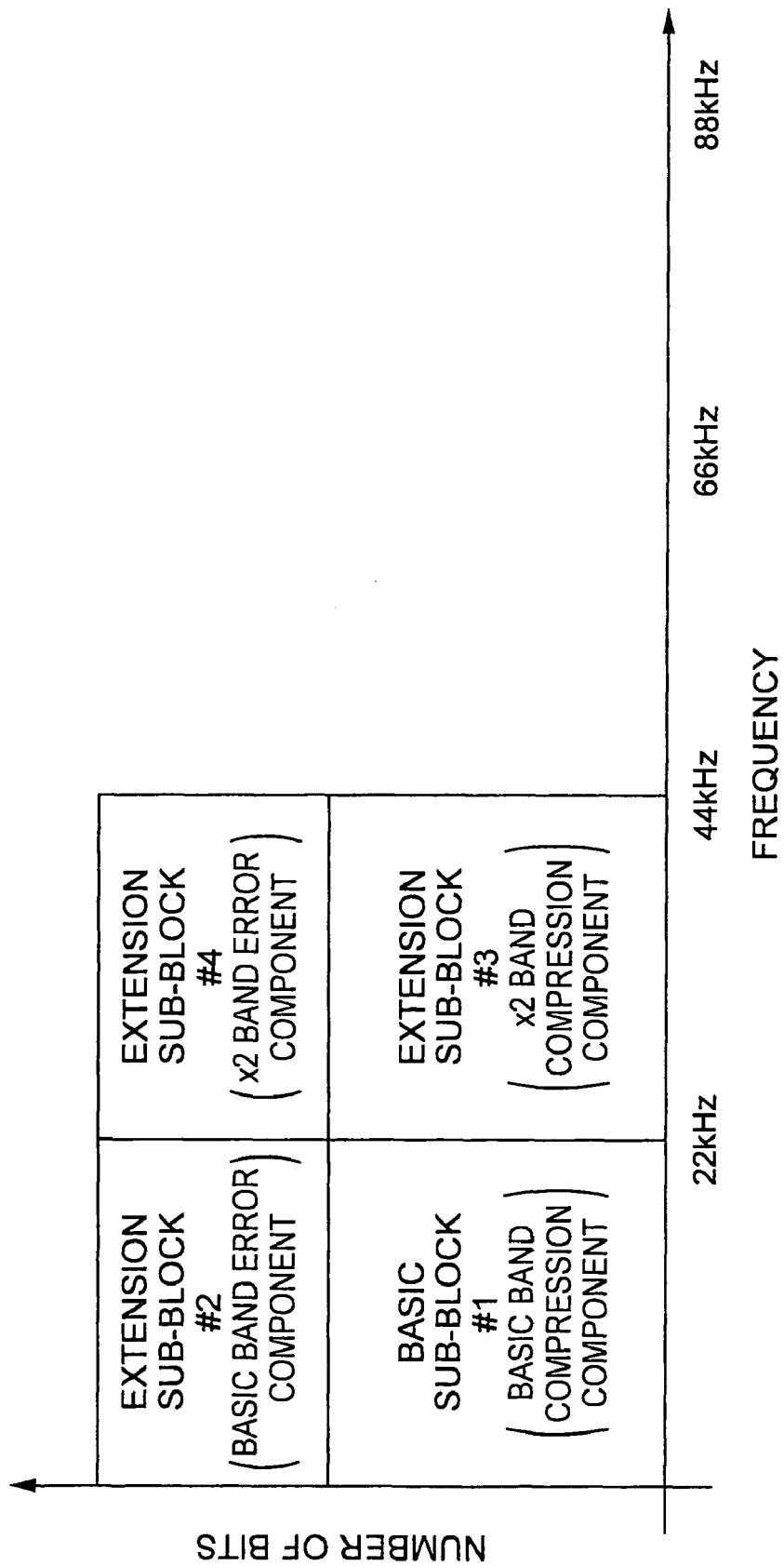
FIG. 17 illustrates the results of the decoding and decompression process performed on the scalably compressed data by the data decoding and decompression system 20.
Figure 18:
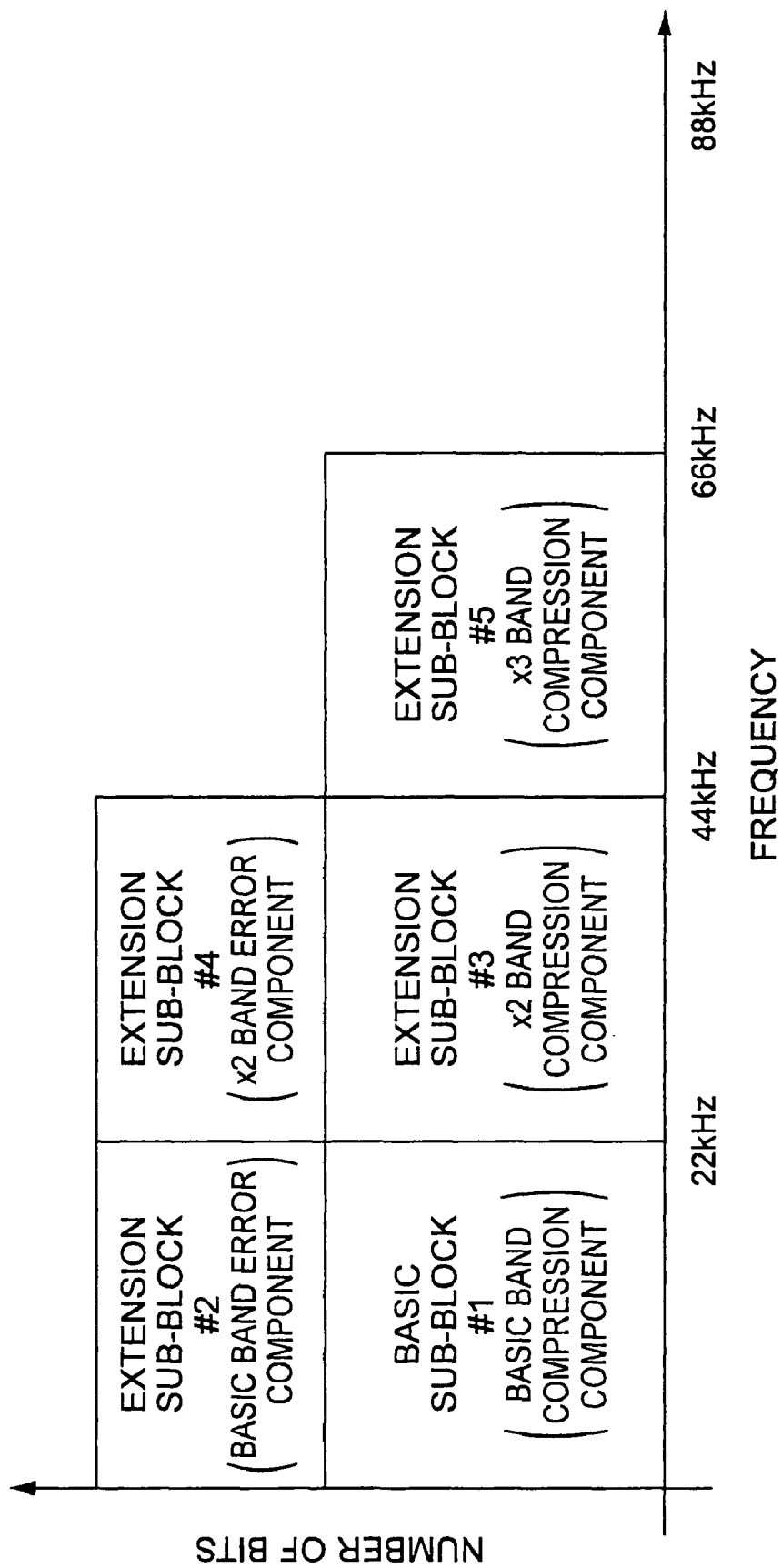
FIG. 18 illustrates the results of the decoding and decompression process performed on the scalably compressed data by the data decoding and decompression system 20.
Figure 19:
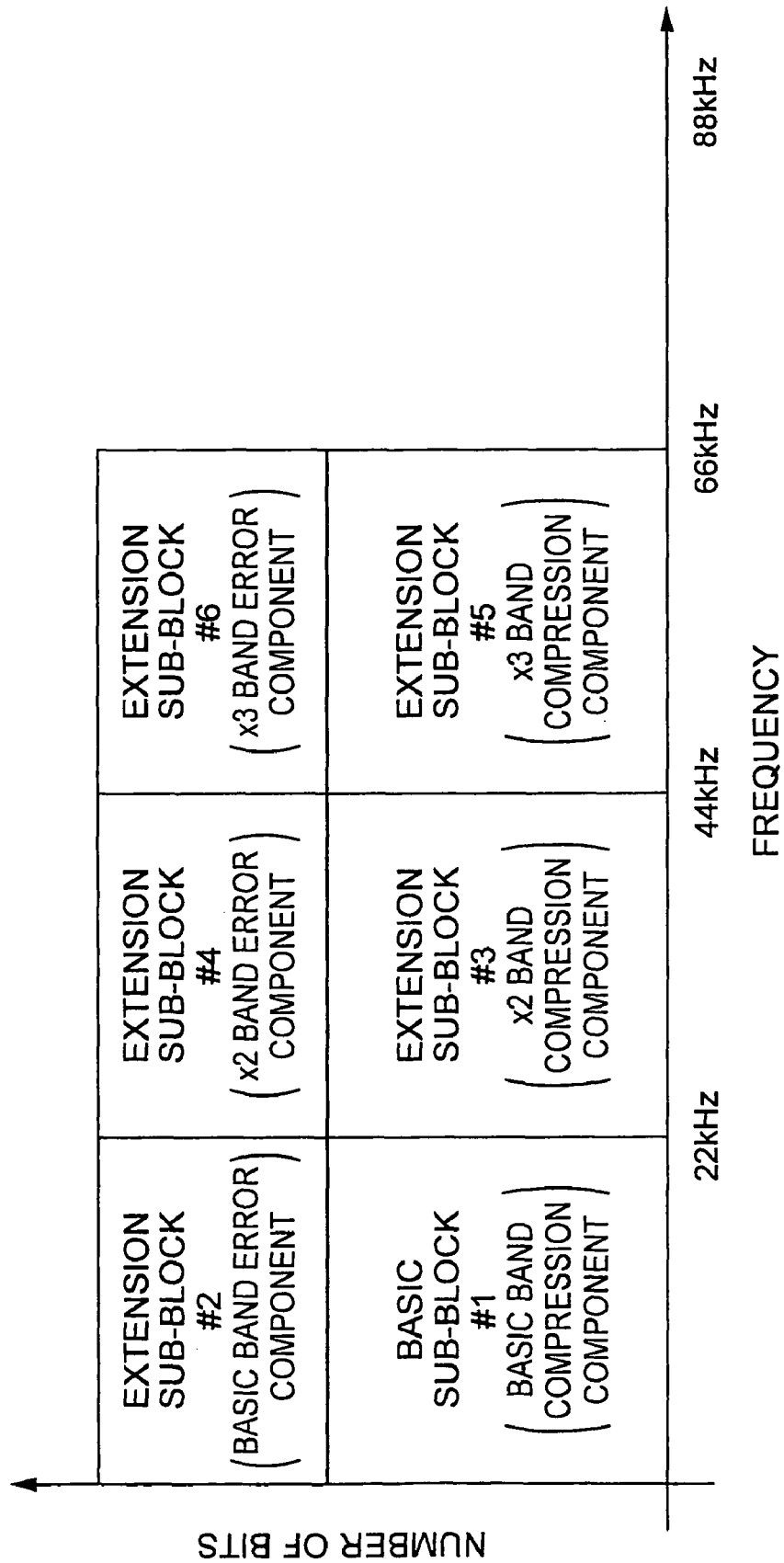
FIG. 19 illustrates the results of the decoding and decompression process performed on the scalably compressed data by the data decoding and decompression system 20.
Figure 20:
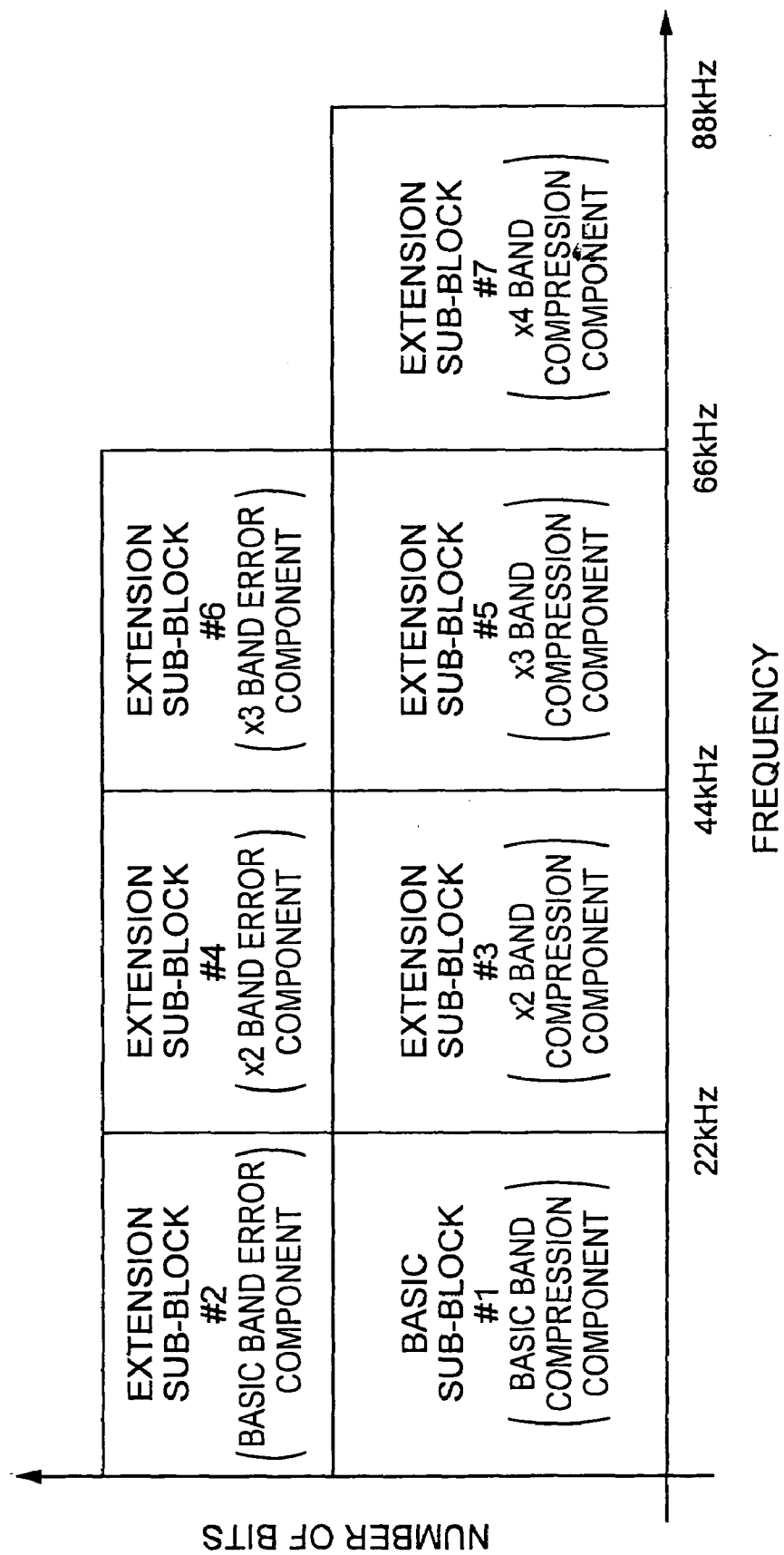
FIG. 20 illustrates the results of the decoding and decompression process performed on the scalably compressed data by the data decoding and decompression system 20.

The extension sub-block #3 is input and the x2 band is reproduced (refer to FIG. 16). Subsequently, the extension sub-block #4 is input, and, then, the quantization error component generated when the x2 band was coded and compressed is reproduced (refer to FIG. 17). In this way, the bands up to the x2 band are reproduced in high-quality.

The data decoding and decompression system 20 obtains the extension sub-blocks #5, #6, . . . in sequence to reproduce the higher band components of the original data in high quality (refer to FIGS. 18 to 21).

Figure 21:
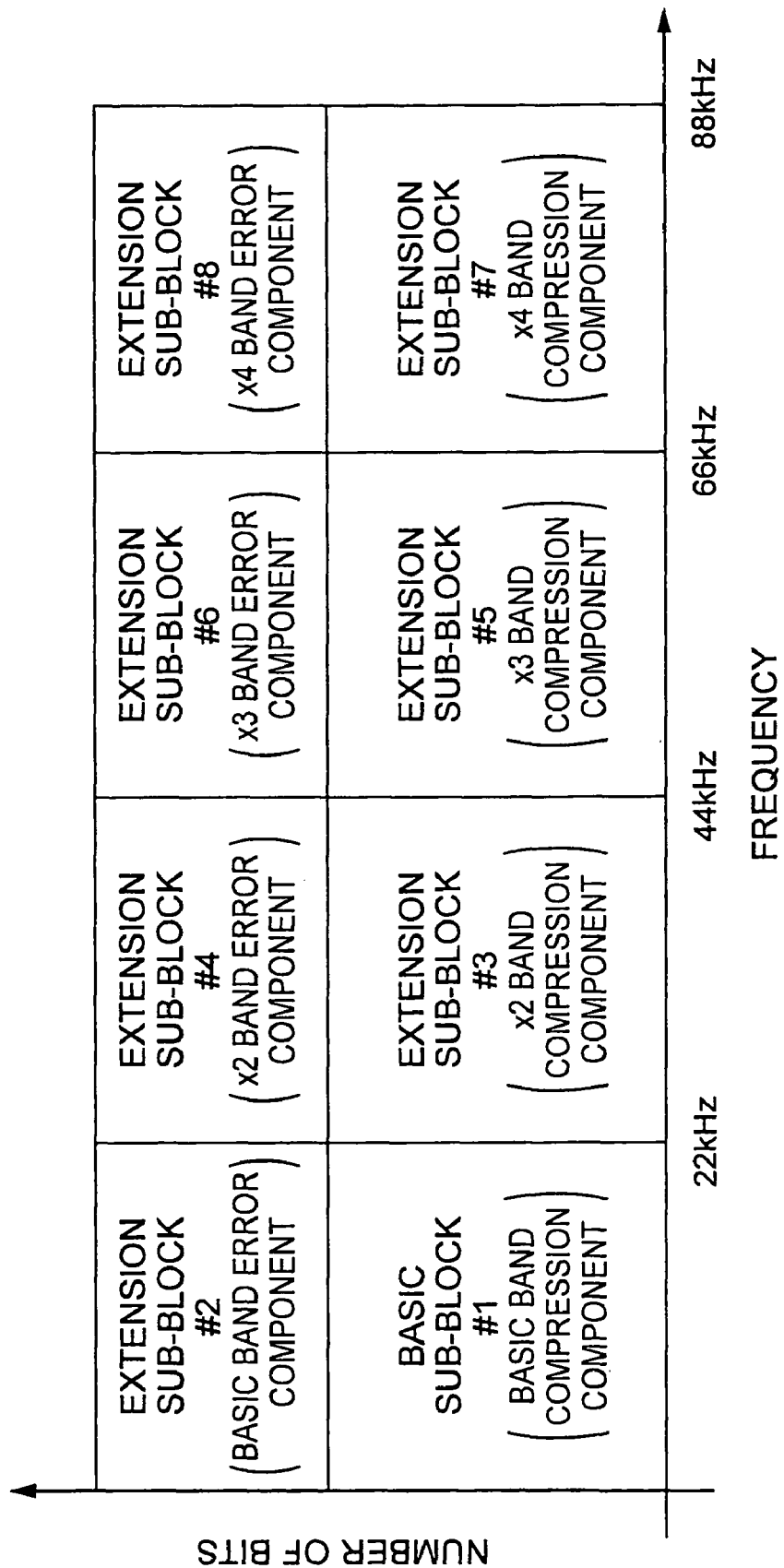
FIG. 21 illustrates the results of the decoding and decompression process performed on the scalably compressed data by the data decoding and decompression system 20.
Figure 22:
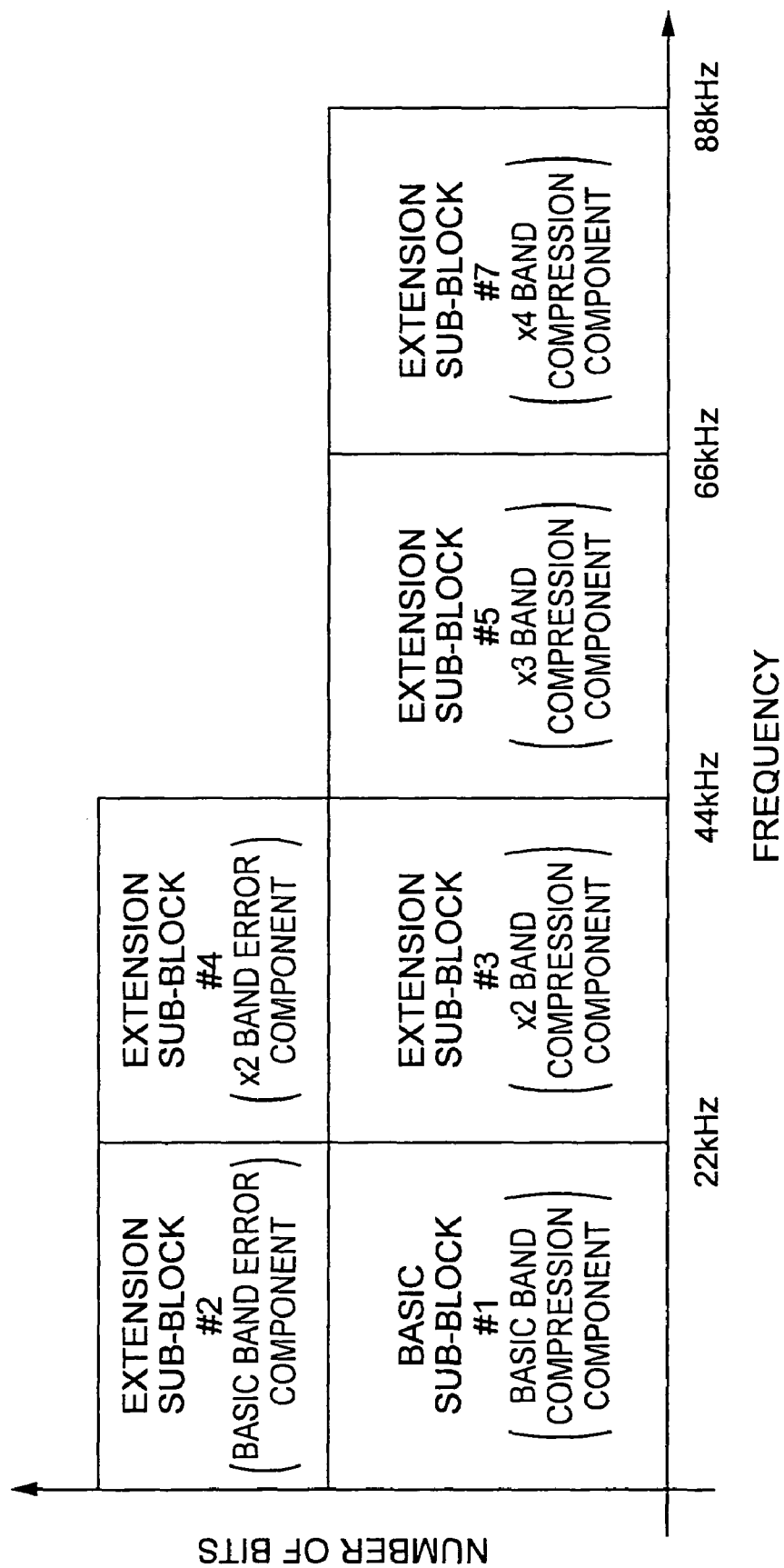
FIG. 22 illustrates the results of the decoding and decompression process performed on the scalably compressed data by the data decoding and decompression system 20.
Figure 23:
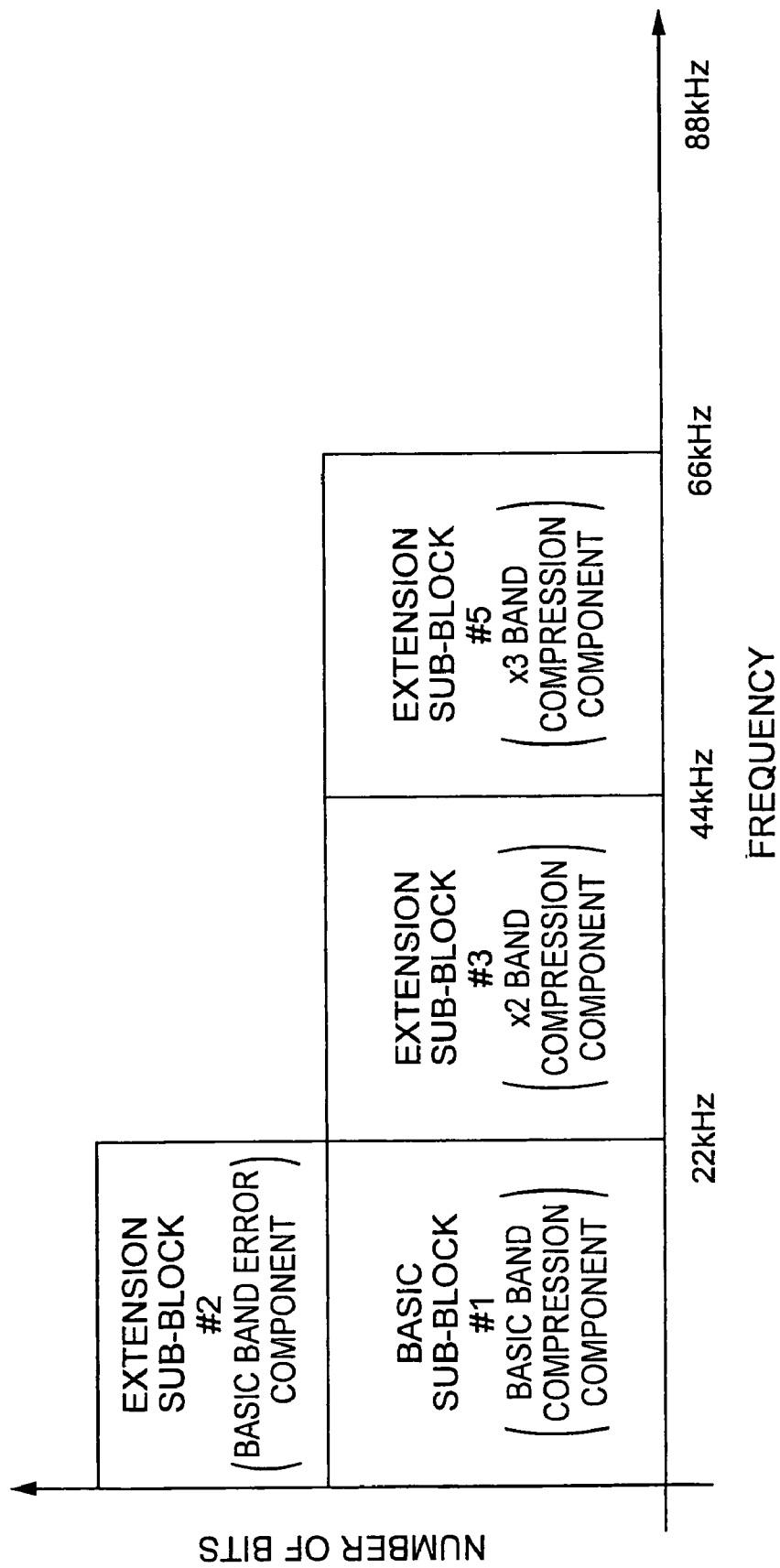
FIG. 23 illustrates the results of the decoding and decompression process performed on the scalably compressed data by the data decoding and decompression system 20.

As a variation of a data decoding and decompression process for generating scalable compressed data, as illustrated in FIG. 21, the compression and coding components for all bands (audible band and x2, x3, and x4 bands) may be reproduced while the quantization error component for only the audible band is reproduced. As another variation, as illustrated in FIG. 22, the compression and coding components for all bands (audible band and x2, x3, and x4 bands) may be reproduced while the quantization error components for only the audible band and the x2 band are reproduced. As another variation, as illustrated in FIG. 23, the compression coding components for the audible band and the x2 and x3 bands may be reproduced while the quantization error component for only the audible band is reproduced. The post-processor 21 refers to the hierarchy ID and the data length added to each sub-block supplied to the data decoding and decompression system 20 to select sub-blocks so that the decoding and decompression results illustrated in FIGS. 22 and 23 are obtained.

As described above, the compressed data is scalable. Therefore, when decompressing the compressed data, the entire data stream and a selective part of the data stream can be decompressed to select and adjust the quality of the decompressed data.

C. Streaming Delivery

According to the data coding and compression system 10 illustrated in FIG. 1, scalable hierarchically-compressed data is obtained. From this data, blocks of data having various bit rates are produced. Streaming delivery of such hierarchically-compressed data reduces the storage capacity on the server used for the streaming data. Since the protocol for controlling the data transfer rate is simplified, a standard protocol such as a transmission control protocol (TCP) can be used to provide a stable streaming delivery through the Internet, which has a variable bandwidth.

Figure 9:
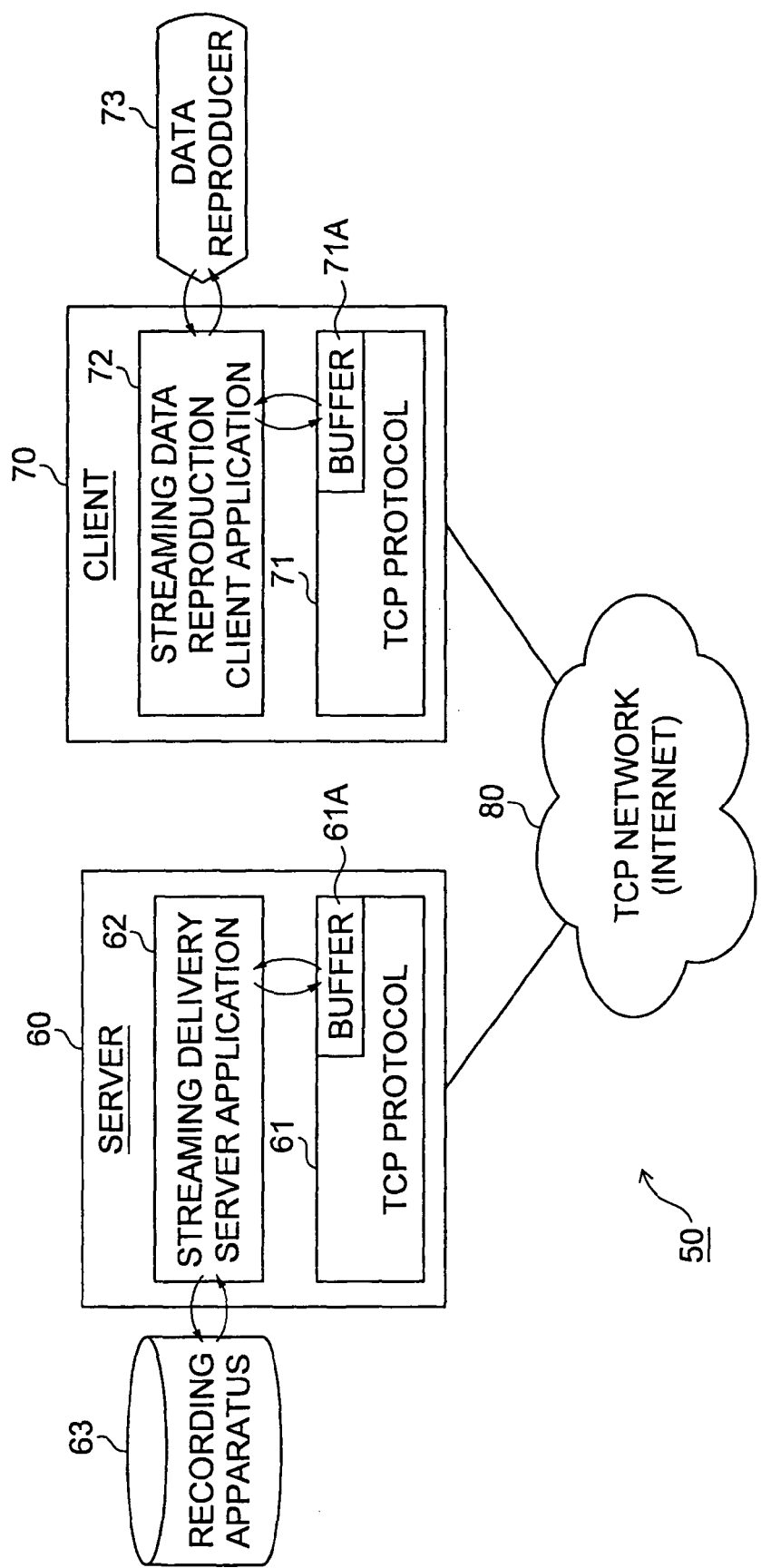
FIG. 9 is a schematic view illustrating a streaming delivery system 50 according to an embodiment of the present invention.

FIG. 9 is a schematic view illustrating the structure of the streaming delivery system 50 according to this embodiment.

As illustrated in FIG. 9, the streaming delivery system 50 includes a server 60 for delivering the data streams and a client 70 for receiving the data streams as the data is reproduced simultaneously.

The server 60 and the client 70 are interconnected via the Internet or other networks such as a TCP network 80. In this embodiment, the TCP network 80 does not necessarily have to have a constant bandwidth in order to carry out a stable streaming delivery.

Although not illustrated in the drawing, a plurality of servers and clients may be connected to the TCP network 80. In addition to the streaming delivery service, the server may provide other various communications services.

On the server 60 providing streaming delivery, a streaming delivery server application 62 operates on a TCP protocol stack 61.

The server application 62 reads out the streaming delivery data from an annexed recording apparatus 63 and performs streaming delivery via the TCP protocol stack 61. For details on a TCP protocol, refer to the Request For Comments (RFC).

Streaming delivery data that has been scalably compressed is stored on the recording apparatus 63. More specifically, the original data is divided into a plurality of bands for each predetermined time block. Then, the data is hierarchically coded and compressed into compression component sub-blocks and quantization component sub-blocks. The sub-blocks are stored in a time series (refer to FIG. 8). Each sub-block includes a hierarchy ID for indicating which time block and band the sub-block belongs to and a data length for indicating the size of the sub-block (refer to FIG. 7). The recording apparatus 63 includes a randomly accessible apparatus such as a hard disk that allows free access to any sub-block by referring to the hierarchy ID and the data length.

The streaming delivery server application 62 reads out a sub-block to be delivered next from the recording apparatus 63 and then writes this sub-block onto a transmission buffer 61A included in the TCP protocol stack 61.

The transmission buffer 61A applies a First In First Out (FIFO) method to deliver the data in chronological order to the TCP network 80. The transmission buffer 61A is installed to compensate for the difference in the timing for reading out the transmission data from the recording apparatus 63 (or the timing for generating the transmission data) and the timing for transmitting the data. The data transmission timing for the TCP protocol stack 61 arrives when the transmission data is written in the transmission buffer 61A (or when the transmission buffer 61A becomes full) by a writing operation of the application 62. When the transmission buffer 61A becomes empty (or when free space is generated) as data is transmitted to the TCP network 80, the subsequent timing for the writing operation of the application 62 arrives.

On the client 70 receiving the streaming data, a streaming data reproduction client application 72 operates on a TCP.

When the TCP protocol stack 71 receives the data delivered via the TCP network 80, the TCP protocol stack 61 writes this data into a receive buffer 71A. The streaming data reproduction client application 72 reproduces the original data by performing inverse-quantization and inverse-MDCT to the data read out from the receive buffer 71A and then outputs the reproduced data from a reproducer 73. This decoding process is carried out by using the compression component sub-blocks for each band and the quantization error component sub-blocks.

As described above, the streaming delivery data that has been scalably compressed is transmitted from the server 60. More specifically, the transmission data is prepared by dividing the original data into a plurality of bands for each predetermined time block and then coded and compressed. Subsequently, the compression component sub-blocks and the quantization component sub-blocks are hierarchically arranged. The client 70 is not aware of how many extension sub-blocks of each of the time blocks have been delivered, but, by identifying the sub-blocks according to their hierarchy IDs, the data can be reproduced.

The receive buffer 71A applies a FIFO method to deliver the data in chronological order to the application 72. The receive buffer 71A is installed to compensate for the difference in the timing for receiving the reception data via the TCP network 80 (or the timing for reproducing the reception data) and the timing for reading out the reception data from the application 72. When the reception data is stored in the receive buffer 71A (or when the receive buffer 71A becomes full) the application 72 reads out the reception data. When the receive buffer 71A becomes empty (or when free space is generated) by the readout operation of the application 72, a timing for the TCP protocol stack 71 to receive subsequent data arrives.

In this embodiment, the original data is provided in a hierarchical structure including a basic sub-block that is essential for data reproduction and a plurality of extension sub-blocks that is not essential for data reproduction but contribute to an improvement in the quality of the reproduced data. The streaming delivery server application 62 transmits the basic sub-blocks without fail and dynamically controls the number of extension sub-blocks to be delivered in accordance with the bandwidth. More specifically, if a timing for transmission arrives during a time period for delivering sub-blocks belonging to the same data block as the data block the previously-delivered sub-blocks belonged to, the remaining extension sub-blocks of the data block are delivered, but if a timing for transmission arrives during a time period for delivering a subsequent data block, the remaining extension sub-blocks are not delivered and the basic sub-block of the subsequent data block is delivered.

In this way, various bit rates can be generated from one set of data by applying a scalable data compression method for further dividing and coding the original data into bands according to the time block units. Since a plurality of coded streams having different bit rates do not have to be prepared from one set of original data to adjust the bit rate, the storage capacity of the recording apparatus 63 can be reduced.

Figure 10:
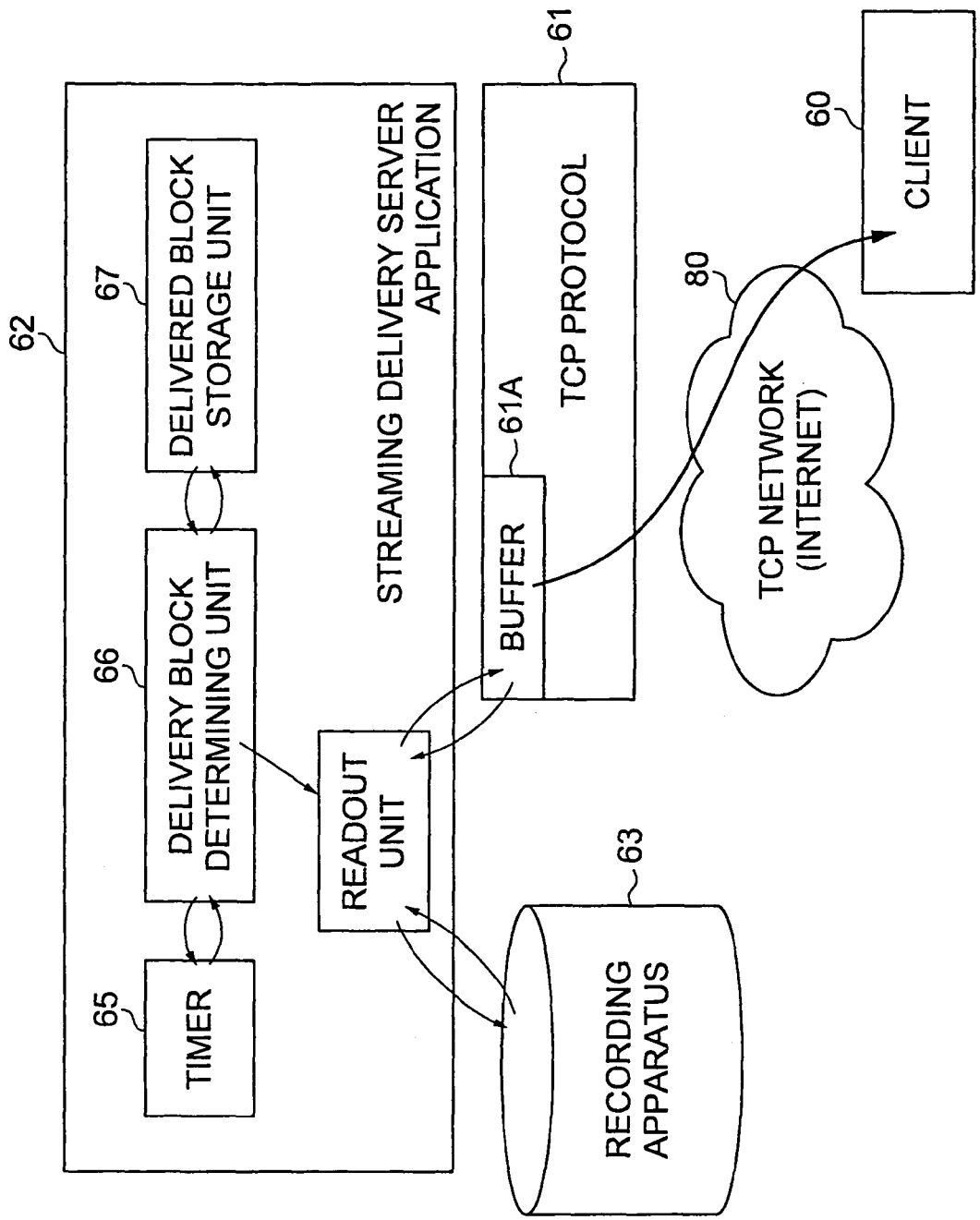
FIG. 10 is a schematic view illustrating the functional structure of the streaming delivery process carried out by a streaming delivery server application 62.

FIG. 10 is a schematic view illustrating the functional structure of the streaming delivery process carried out by the streaming delivery server application 62.

As illustrated in the drawing, the streaming delivery server application 62 includes a timer 65, a delivery block determining unit 66, and a delivered block storage unit 67.

To carry out streaming delivery in which downloading and reproducing of data is performed simultaneously, the bit rate must be dynamically adjusted by the server 60 to enable uninterrupted data reproduction at the client without being affected by a change in the bandwidth.

Data to be transmitted is divided into a plurality of bands for each predetermined time block and is further divided into hierarchically arranged delivery blocks of a basic sub-block that is essential to data reproduction and a plurality of extension sub-blocks that contribute to the improvement of the quality of the reproduced data. Thus, to avoid interruption in the data, the basic sub-blocks for each predetermined time block must be delivered. Moreover, to improve the quality of the reproduced data, the extension sub-blocks are delivered depending on the leeway in the bandwidth.

The timer 65 measures the actual time by a system timer (not depicted in the drawing).

The delivery block determining unit 66 refers to the timing value of the timer 65 and calculates the time block for when the transmitting timing was detected. If a timing for transmission arrives during a time period for delivering sub-blocks belonging to the same data block as the data block the previously-delivered sub-blocks belonged to, the remaining extension sub-blocks of the data block are delivered, but if a timing for transmission arrives during a time period for delivering a subsequent data block, the remaining extension sub-blocks are not delivered and the basic sub-block of the subsequent data block is delivered. To determine which block to deliver, the delivery block determining unit 66 uses the delivered block storage unit 67 to maintain the hierarchy ID of the block $B_{last}$ and the sub-block $SB_{last}$ that were delivered last.

The delivery block determining unit 66 determines the block and the sub-block to be delivered by the above-mentioned mechanism. Then, the delivery block determining unit 66 reads out the applicable data from the recording apparatus 63 and writes this data into the transmission buffer 61A of the TCP protocol stack 61.

Figure 11:
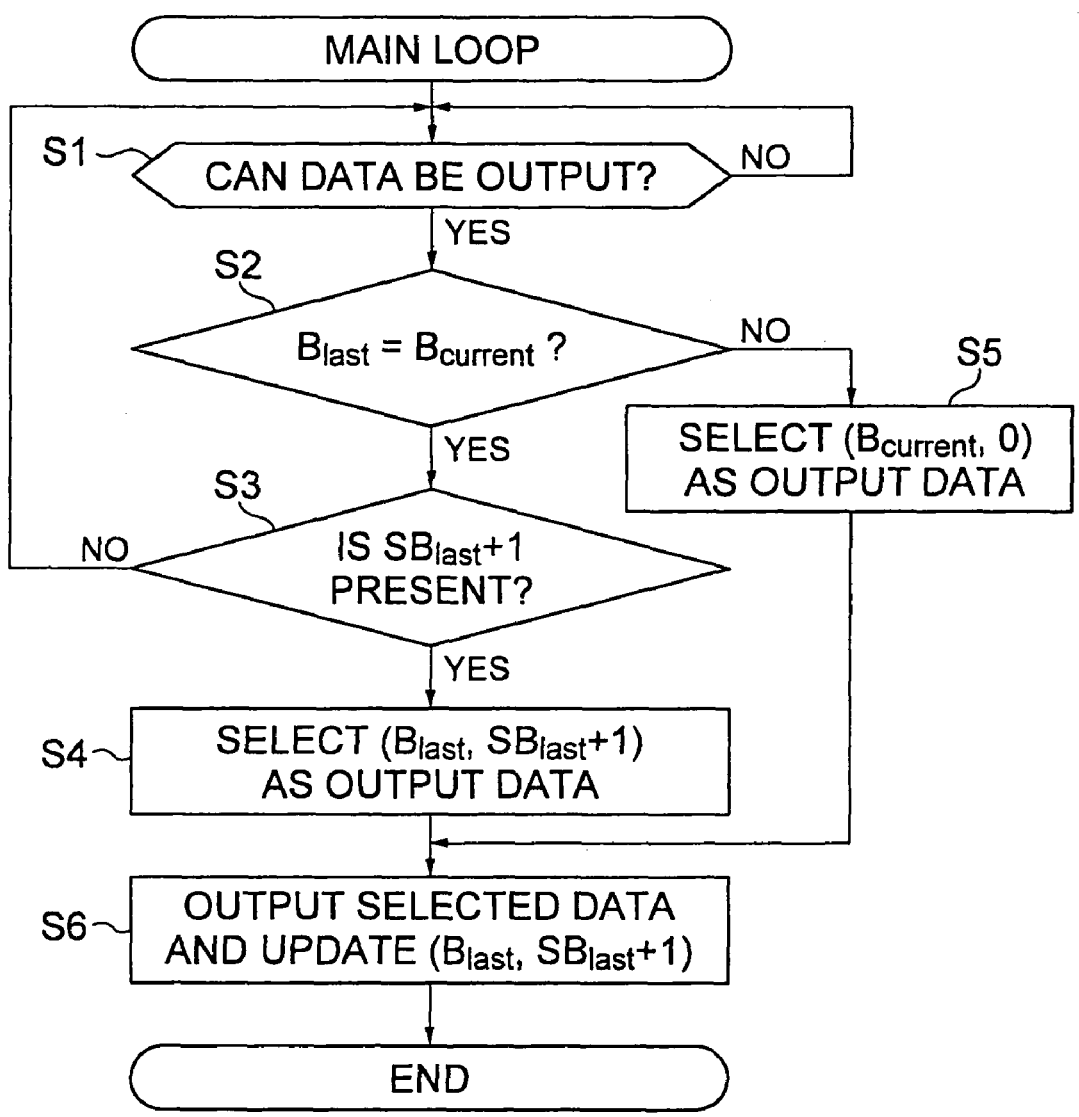
FIG. 11 is a flow chart indicating the steps of a streaming delivery process carried out by the streaming delivery server application 62.

FIG. 11 is a flow chart describing the streaming delivery process by the streaming delivery server application 62.

The server application 62 checks the free space in the transmission buffer 61A of the TCP protocol stack 61 and determines whether the output timing has arrived (Step S1).

If the output timing has arrived, the server application 62 refers to the timing value of the timer 65 and calculates the current time block $B_{current}$. Also, the server application 62 refers to the delivered block storage unit 67 to detect the block $B_{last}$ that was delivered last. The server application 62 determines whether the block $B_{last}$ that was delivered last matches the current time block $B_{current}$ (Step S2).

If the block $B_{last}$ that was delivered last matches the current time block $B_{current}$, the sub-block $SB_{last}$ that was delivered last stored in the delivered block storage unit 67 is read out. Then, the server application 62 checks whether a subsequent sub-block $SB_{last}+1$ is present in the same time block $B_{last}$ (Step S3).

If a subsequent sub-block $SB_{last}+1$ is not present in the same time block $B_{last}$, the process returns to Step S1 since all the sub-blocks in the time block $B_{last}$ have already been transmitted. Then, the server application 62 waits for the data transmission timing for the next time block.

If a subsequent sub-block $SB_{last}+1$ is present in the same time block $B_{last}$, the subsequent sub-block $SB_{last}+1$ is selected in the same time block $B_{last}$ as output data (Step S4). The selected sub-block is read out from the recording apparatus 63 and is written in the transmission buffer 61A of the TCP protocol stack 61 (Step S6). Then, the delivered block storage unit 67 updates the content of the data stored in the delivered block storage unit 67.

If the block $B_{last}$ that was delivered last does not match the current time block $B_{current}$ in Step S2, the basic sub-block of the current time block $B_{current}$ is selected as output data since the time block for transmitting the block $B_{last}$ that was delivered last has already elapsed (Step S5). The selected sub-block is read out from the recording apparatus 63 and is written in the transmission buffer 61A of the TCP protocol stack 61 (Step S6). At the same time, the content of the stored data is updated.

Subsequently, the process returns to Step S1 and the streaming delivery server application 62 waits for a subsequent data transmission timing.

Figure 24A:
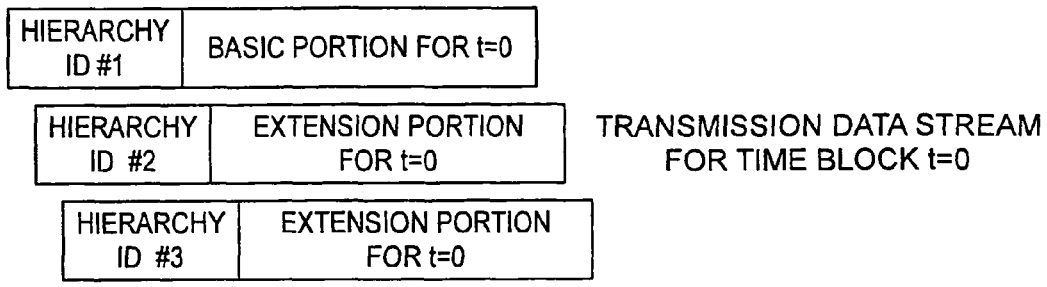
FIG. 24, consisting of FIG. 24A, FIG. 24B, and FIG. 24C, is a schematic view of the structure of the data stream delivered from a server 60.
Figure 24B:
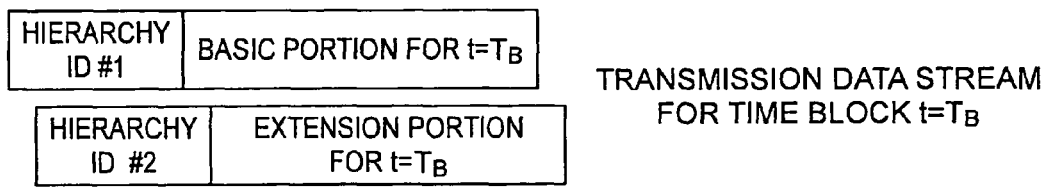
Figure 24C:
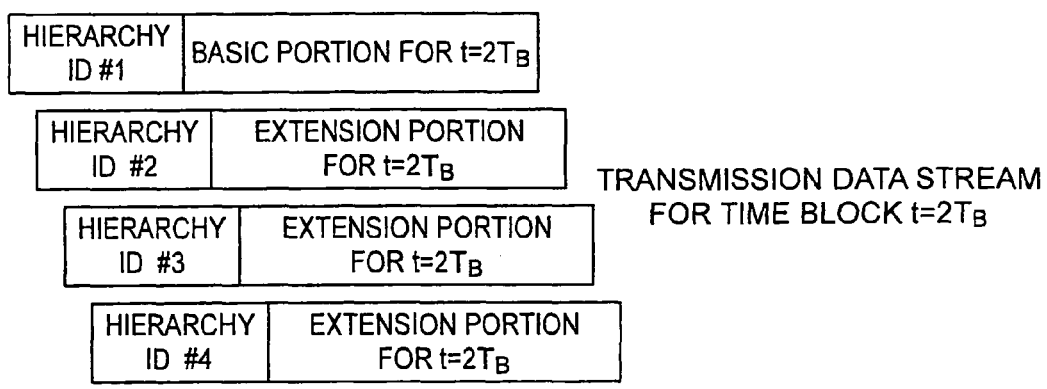

FIG. 24 is a schematic view of the structure of the data streams delivered from the server 60. In this embodiment, the streaming delivery data is processed per each predetermined time block $T_B$. The number of sub-blocks to be delivered is determined according to the bandwidth for the time block. As a result, the bit rate of the data stream is dynamically adjusted and controlled. According to the embodiment illustrated in FIG. 24, in the time block for t=0, the basic sub-block of hierarchy #1 and extension sub-blocks of hierarchy #2 and #3 are delivered. In the time block for t=$T_B$, the basic sub-block of hierarchy #1 and only the extension sub-block of hierarchy #2 are delivered.

As described above, the streaming delivery system 50 according to this embodiment can easily prepare datasets having various bit rates in accordance with the bandwidth in each time block $T_B$ from one set of data such as the dataset illustrated in FIG. 8. Accordingly, the protocol for controlling the bit rate is simplified, so that, even when the streaming delivery system 50 is installed on a standard TCP, sufficiently stable streaming delivery is possible. Moreover, the storage capacity of the recording apparatus 63 of the server 60 can be reduced.

Figure 12:
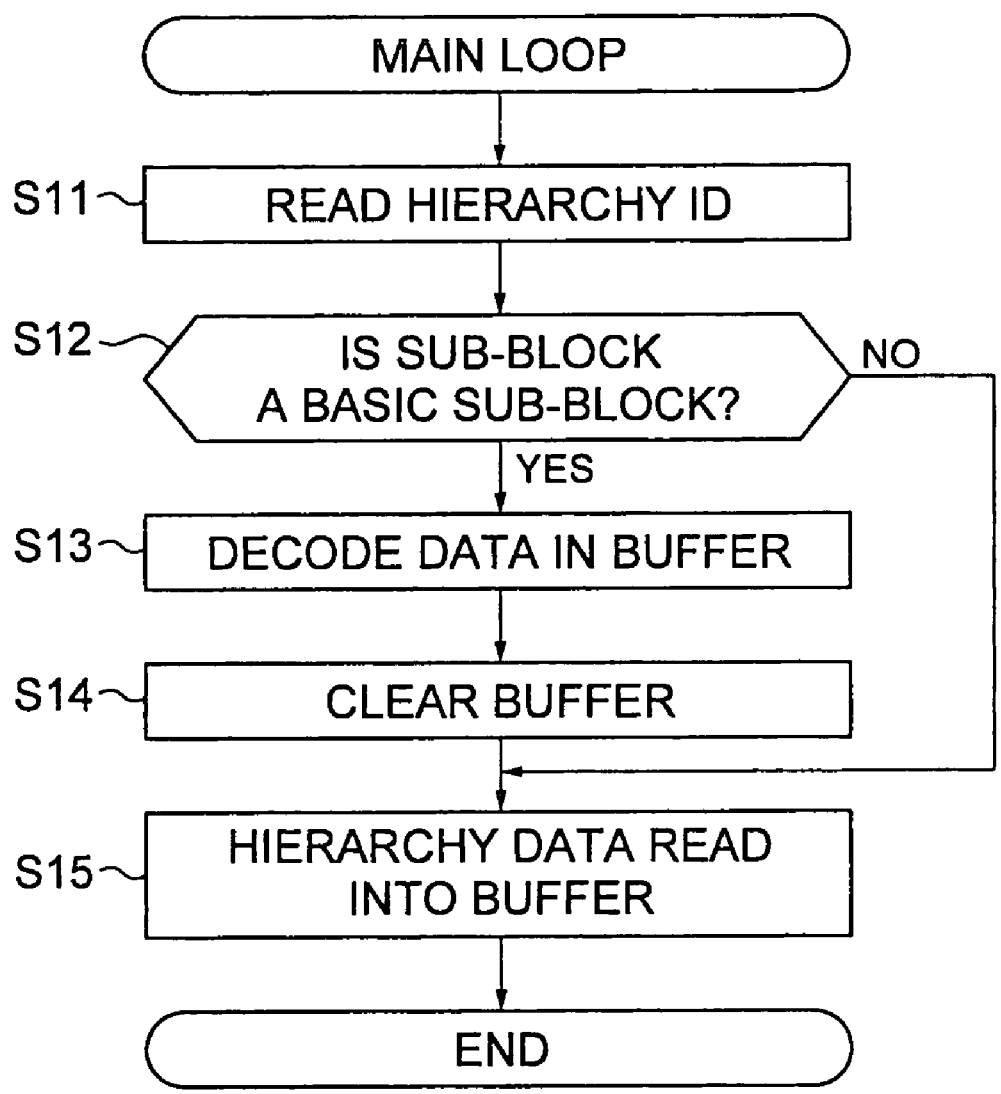
FIG. 12 is a flow chart indicating the steps of receiving streaming delivery data by a client application 7 for reproducing streaming delivery data.

The streaming data reproduction client application 72 reproduces the original data by carrying out inverse-quantization and inverse-MDCT on the data read out from the receive buffer 71A and then outputs the data from the reproducer 72. FIG. 12 is a flow chart indicating the reception process of the streaming data by the streaming data reproduction client application 72.

The client application 72 reads the hierarchy ID in the head of the sub-block read out from the receive buffer 71A (Step S11).

Then, based on the hierarchy ID, the client application 72 determines whether the read out sub-block is the basic sub-block for the applicable time block (Step S12).

If the read out sub-block is a basic sub-block, the sub-blocks in the buffers of the decoding and decompressing units of each hierarchy make up all the data available for a data block. Therefore, the data in each buffer is decoded. Then, after the decoded data is sent out from the reproducer 73 (Step S13), the receive buffer 71A is cleared (Step S14). Subsequently, the data of the basic sub-block is read in the same manner as sub-blocks of other hierarchies (Step S15).

If the read sub-block is not a basic sub-block, the sub-blocks of the applicable hierarchy are read into the input buffers of the decoding and decompression unit of each hierarchy in sequence (Step S15).

Addendum

In the above, the present invention has been described in detail by referring to a particular embodiment. It is, however, apparent that anyone skilled in the art may apply modifications and substitutions to the particular embodiment without going beyond the scope of the present invention. In other words, the present invention is not limited to the disclosed embodiments included in the specification. To understand the content of the present invention, the claims stated earlier must be referred to.

INDUSTRIAL APPLICABILITY

According to the present invention, an excellent data processing system for streaming delivery of data via a communication line having a variable bandwidth, an excellent data processor and a data processing method for preparing, transmitting, and receiving data for streaming delivery, and a computer program are provided.

According to the present invention, an excellent data processing system for a stable streaming delivery using a scalable data compression method, an excellent data processor and a data processing method for preparing, transmitting, and receiving data for streaming delivery by a scalable data compression method, and a computer program are provided.

According to the present invention, a single apparatus or an information compression method can be efficiently used at a wide-range of compression ratios. In particular, when the bandwidth of a transmission line is not stable, data having a compression ratio corresponding to the bandwidth can be automatically prepared.

According to the present invention, a compressed bit stream can correspond to a plurality of bit rates. Thus, the same compressed bit stream can be used for transferring information through transmission lines having various transfer rates and recording information on recording media having different recording capacities (densities). Therefore, a plurality of bit streams having different compression ratios that correspond to the transfer lines and recording media does not have to be provided. Consequently, a standard for a system can be easily established and the size of the apparatus can be reduced.

The invention claimed is:

1. A data processing system comprising:
a first data processor comprising:
transmission data generating means for preparing a basic sub-block essential for reproducing original data and at least one extension sub-block essential for improving the quality of the reproduced data by dividing the original data into a plurality of blocks, further dividing each of the plurality of blocks into a plurality of frequency bands, and then compressing the data of the plurality of frequency bands;
transmission means for transmitting the prepared basic sub-block and said at least one extension sub-block;
timing generating means for generating a timing for transmitting the basic sub-block and said at least one extension sub-block; and
transmission controlling means for transmitting the basic sub-block of a current block based on the timing generated by the timing generating means, for determining, after transmitting the basic sub-block, whether said at least one extension sub-block of the current block can be transmitted before a basic sub-block of a subsequent block is transmitted, and for selectively transmitting said at least one extension sub-block of the current block if it has been determined that said at least one extension sub-block can be transmitted; and
a second data processor comprising: receiving means for receiving a basic sub-block and at least one extension sub-block transmitted from the first data processor;
reproducing means for reproducing data from the sub-blocks received by the receiving means; and
reproduction controlling means for reproducing data, if the sub-block received is determined to be a basic sub-block, by supplying the basic sub-block and said at least one extension sub-block received by the receiving means before a subsequent basic sub-block is received by the receiving means to the reproducing means.

2. A data processing method comprising the steps of: generating a basic sub-block essential for reproducing original data and at least one extension sub-block essential for improving the quality of the reproduced data by dividing the original data into a plurality of blocks, further dividing each of the plurality of blocks into a plurality of frequency bands, and then compressing the plurality of frequency bands; and
transmitting a basic sub-block of a current block based on a predetermined time unit, determining, after transmitting the basic sub-block, whether said at least one extension sub-block of the current block can be transmitted before a basic sub-block of a subsequent block is transmitted, and transmitting said at least one extension sub-block of the current block if it has been determined that said at least one extension sub-block can be transmitted.

3. The data processing method according to claim 2 wherein identification information for identifying the sub-blocks is added to each of the sub-blocks.

4. The data processing method according to claim 3 wherein the identification information includes information indicating the data size of the sub-blocks.

5. The data processing method according to claim 3 wherein the identification information includes information indicating whether the sub-block is a basic sub-block or an extension sub-block.

6. The data processing method according to claim 2 wherein each frequency band is compressed to generate a compression component and a compression error component, the basic sub-block is the compression component of the lowest frequency band, and said at least one extension sub-block is the compression error components of the lowest frequency band and the compression components and the compression error components of the frequency bands other than the lowest frequency band.

7. The data processing method according to claim 6 wherein a compression error component of a frequency band is recompressed to generate a recompression component and a recompression error component, and the recompression component and the recompression error component are extension sub-blocks.

8. The data processing method according to claim 2 wherein at least one extension sub-block to be transmitted is selected from a plurality of the extension sub-block.

9. The data processing method according to claim 2 wherein, after a basic sub-block is transmitted, at least one extension sub-block generated from the same block as the basic sub-block is transmitted if a transmission timing for transmitting a sub-block is detected before a basic sub-block of a subsequent block is transmitted.

10. A data processor comprising:
transmission data generating means for preparing a basic sub-block essential for reproducing original data and at least one extension sub-block essential for improving the quality of the reproduced data by dividing the original data into a plurality of blocks, further dividing each of the plurality of blocks into a plurality of frequency bands, and then compressing the plurality of frequency bands;
transmission means for transmitting the generated sub-blocks; and
transmission controlling means for transmitting a basic sub-block of a current block based on a predetermined time unit, determining, after transmitting the basic sub-block, whether said at least one extension sub-block of the current block can be transmitted before a basic sub-block of a subsequent block is transmitted, and transmitting said at least one extension sub-block of the current block if it has been determined that said at least one extension sub-block can be transmitted.

11. The data processor according to claim 10 wherein the transmission data generating means adds identification information for identifying the sub-blocks to each of the sub-blocks.

12. The data processor according to claim 11 wherein the identification information includes information indicating the data size of the sub-blocks.

13. The data processor according to claim 11 wherein the identification information includes information indicating whether the sub-block is a basic sub-block or an extension sub-block.

14. The data processor according to claim 10 wherein each frequency band is compressed to generate a compression component and a compression error component, the basic sub-block is the compression component of the lowest frequency band, and said at least one extension sub-block is the compression error components of the lowest frequency band and the compression components and the compression error components of the frequency bands other than the lowest frequency band.

15. The data processor according to claim 14 wherein a compression error component of a frequency band is recompressed to generate a recompression component and a recompression error component, and the recompression component and the recompression error component are extension sub-blocks.

16. The data processor according to claim 10 wherein at least one extension sub-block to be transmitted is selected from a plurality of the extension sub-block.

17. The data processor according to claim 10 further comprising:
a timing generation means for generating a timing for transmitting a basic sub-block or an extension sub-block,
wherein the transmission controlling means transmits a basic sub-block when the timing for transmitting a basic sub-block was detected and an extension sub-block generated from the same block as the basic sub-block is transmitted if a transmission timing for transmitting a sub-block is detected before a basic sub-block of a subsequent block is transmitted.

18. A tangible computer recording medium having program code stored thereon, the program code providing instructions that are executable to provide operations comprising:
dividing the data into a plurality of blocks of a predetermined time unit;
generating a basic sub-block essential for reproducing original data and at least one extension sub-block essential for improving the quality of the reproduced data by dividing the original data into a plurality of blocks, further dividing each of the plurality of blocks into a plurality of frequency bands, and then compressing one of the plurality of frequency bands; and
transmitting a basic sub-block of a current block based on a predetermined time unit, determining, after transmitting the basic sub-block, whether said at least one extension sub-block of the current block can be transmitted before a basic sub-block of a subsequent block is transmitted, and transmitting said at least one extension sub-block of the current block if it has been determined that said at least one extension sub-block can be transmitted.

* * * * *